(12) United States Patent
Paillet et al.

(10) Patent No.: US 12,339,687 B2
(45) Date of Patent: Jun. 24, 2025

(54) VOLTAGE REGULATOR WITH BINARY SEARCH AND LINEAR CONTROL

(71) Applicant: Intel Corporation, Santa Clara, CA (US)

(72) Inventors: Fabrice Paillet, Portland, OR (US); Anand Ramasundar, Portland, OR (US); Khondker Ahmed, Hillsboro, OR (US); Harish K. Krishnamurthy, Hillsboro, OR (US); Cary Renzema, North Plains, OR (US); Christopher Mandic, Hillsboro, OR (US); James Keith Hodgson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 763 days.

(21) Appl. No.: 17/483,381

(22) Filed: Sep. 23, 2021

(65) Prior Publication Data

US 2023/0092022 A1   Mar. 23, 2023

(51) Int. Cl.
*G05F 1/56* (2006.01)
*G05F 1/575* (2006.01)

(52) U.S. Cl.
CPC ..................................... *G05F 1/56* (2013.01)

(58) Field of Classification Search
CPC .................................. G05F 1/56; G05F 1/575
See application file for complete search history.

(56) References Cited

U.S. PATENT DOCUMENTS

| | | | |
|---|---|---|---|
| 9,722,606 B2 * | 8/2017 | Raychowdhury | .... H03K 3/0377 |
| 10,216,209 B1 * | 2/2019 | Ham | ........................ G05F 1/575 |

(Continued)

FOREIGN PATENT DOCUMENTS

| | | | | |
|---|---|---|---|---|
| CN | 110045774 A | * | 7/2019 | ............ G05F 1/561 |
| CN | 111208858 A | * | 5/2020 | ............... G05F 1/56 |

(Continued)

OTHER PUBLICATIONS

Ahmed, K., et al., "A Variation-Adaptive Integrated Computational Digital LDO in 22-nm CMOS With Fast Transient Response", IEEE Journal of Solid-State Circuits, vol. 55, No. 4, Apr. 2020, pp. 977-987.

(Continued)

*Primary Examiner* — Sisay G Tiku
(74) *Attorney, Agent, or Firm* — NICHOLSON DE VOS WEBSTER & ELLIOTT LLP

(57) ABSTRACT

An apparatus, system, and method for voltage regulator (VR) control are provided. An apparatus can include first, second, and third comparators configured to determine whether a load voltage (VLOAD) drops below a lower non-linear control (NLC) threshold, drops below a lower linear control (LC) threshold, and exceeds an upper LC threshold, respectively. The apparatus can include power gates (PGs) configured to adjust an output voltage (VOUT) based on a provided power gate (PG) code. The apparatus can include voltage regulator (VR) controller circuitry comprising synchronous LC circuitry and asynchronous NLC circuitry, the LC circuitry configured to increment or decrement the PG code responsive to the VLOAD dropping below the LC threshold and exceeding the upper LC threshold, respectively, and the NLC circuitry configured to increase the PG code based on a number of consecutive NLC droop events and responsive to the VLOAD dropping below the lower NLC threshold.

19 Claims, 15 Drawing Sheets

(56) References Cited

U.S. PATENT DOCUMENTS

| | | | |
|---|---|---|---|
| 2006/0055388 A1* | 3/2006 | Tang | H02M 3/1584 323/284 |
| 2012/0200274 A1* | 8/2012 | Tang | H02M 3/1584 323/271 |
| 2014/0167813 A1* | 6/2014 | Raychowdhury | G05F 1/59 326/33 |
| 2018/0284823 A1* | 10/2018 | Na | G05F 1/575 |
| 2020/0393861 A1* | 12/2020 | Shih | G05F 1/563 |
| 2021/0240142 A1* | 8/2021 | Bang | G05B 11/42 |
| 2021/0271277 A1* | 9/2021 | Ahmed | G05F 1/575 |
| 2023/0205244 A1* | 6/2023 | Ramasundar | G05F 1/59 323/280 |

FOREIGN PATENT DOCUMENTS

| | | | | |
|---|---|---|---|---|
| EP | 3851933 B1 * | 1/2024 | | G05F 1/563 |
| WO | WO-2019156763 A1 * | 8/2019 | | G05F 1/563 |

OTHER PUBLICATIONS

Berry, C., et al., "IBM z14: Processor Characterization and Power Management for High-Reliability Mainframe Systems", IEEE Journal of Solid-State Circuits, vol. 54, No. 1, Jan. 2019, pp. 121-132.

Burton, E. A., et al., "FIVR—Fully Integrated Voltage Regulators on 4th Generation Intel (Registered) Core (Trademark) SoCs", 2014 IEEE Applied Power Electronics Conference and Exposition—APEC 2014, Mar. 16-20, 2014, pp. 432-439.

Extended European Search Report and Search Opinion, EP App. No. 22188515.5, Feb. 2, 2023, 12 pages.

Mahajan, T., et al., "Digitally Controlled Voltage Regulator Using Oscillator-based ADC with fast-transient-response and wide dropout range in 14nm CMOS", IEEE, 2017, 4 pages.

Singh, T., et al., "Zen: A Next-Generation High-Performance x86 Core", ISSCC 2017 / Session 3 / Digital Processors / 3.2, 2017 IEEE International Solid-State Circuits Conference, Feb. 6, 2017, 3 pages.

* cited by examiner

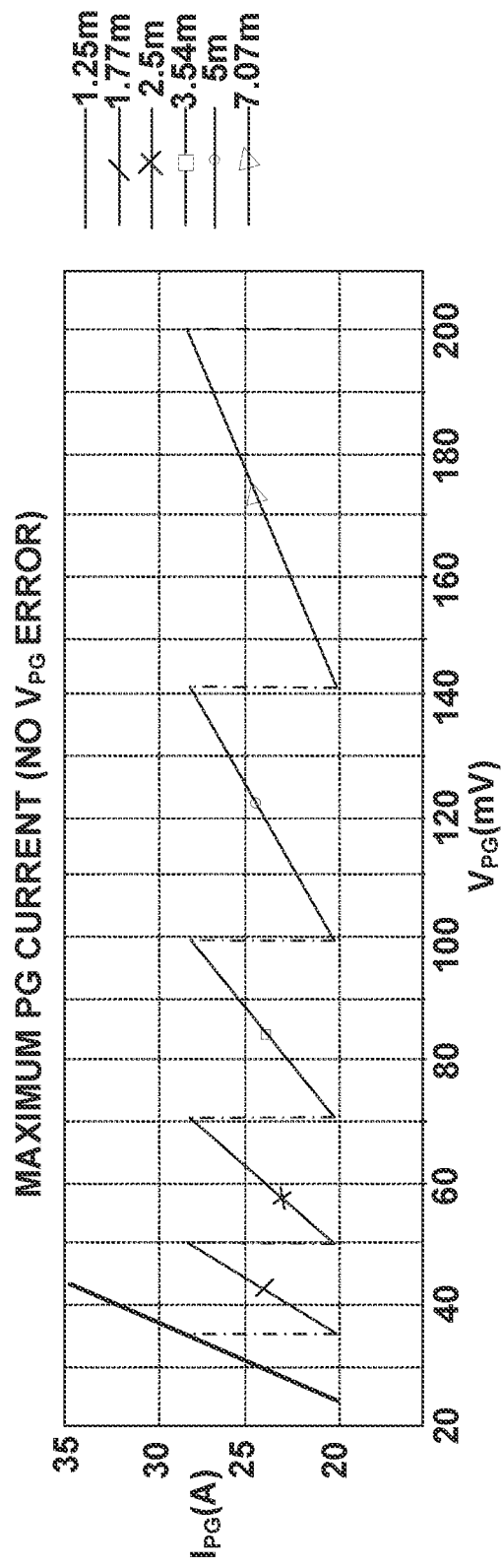
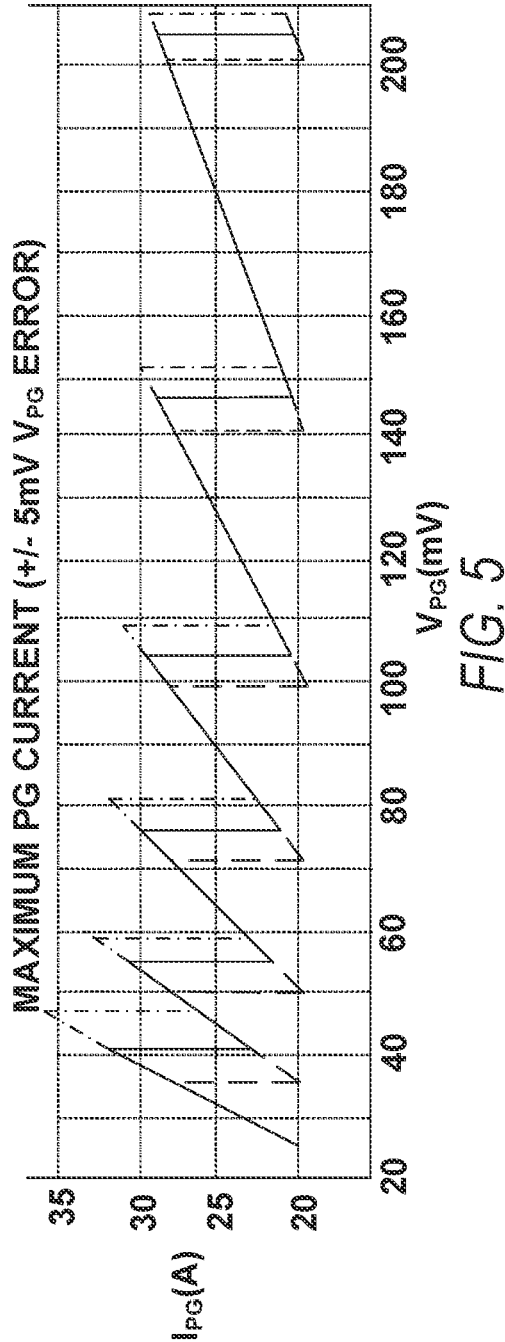
FIG. 5

1400

1440 — RECEIVE, AT VOLTAGE REGULATOR (VR) CONTROLLER CIRCUITRY AND FROM FIRST, SECOND, AND THIRD COMPARATORS DATA INDICATING WHETHER A LOAD VOLTAGE (VLOAD) (I) DROPS BELOW A LOWER NON-LINEAR CONTROL (NLC) THRESHOLD, (II) DROPS BELOW A LOWER LINEAR CONTROL (LC) THRESHOLD, AND (III) EXCEEDS AN UPPER LC THRESHOLD, RESPECTIVELY

1442 — RESPONSIVE TO THE RECEIVED DATA, DETERMINE, BY THE VR CONTROLLER CIRCUITRY, WHETHER TO ACTIVATE SYCHRONOUS LC CIRCUITRY OR ASYNCHRONOUS NLC CIRCUITRY, THE LC CIRCUITRY CONFIGURED TO INCREMENT OR DECREMENT A POWER GATE (PG) CODE RESPONSIVE TO THE VLOAD DROPPING BELOW THE LC THRESHOLD AND EXCEEDING THE UPPER LC THRESHOLD, RESPECTIVELY, AND THE NLC CIRCUITRY CONFIGURED TO INCREASE THE PG CODE BASED ON A NUMBER OF CONSECUTIVE NLC DROOP EVENTS AND RESPONSIVE TO THE VLOAD DROPPING BELOW THE LOWER NLC THRESHOLD

1444 — PROVIDE, BY THE ACTIVATED SYCHRONOUS LC CIRCUITRY OR ASYNCHRONOUS NLC CIRCUITRY, THE PG CODE TO PGS CONFIGURED TO ADJUST AN OUTPUT VOLTAGE (VOUT) BASED ON THE PROVIDED PG CODE

1446 — PROVIDE THE ADJUSTED VOUT TO A LOAD

*FIG. 14*

VOLTAGE REGULATOR WITH BINARY SEARCH AND LINEAR CONTROL

TECHNICAL FIELD

Embodiments pertain to voltage regulators (VRs). Some embodiments relate to digital linear (DL) VRs (DLVRs) with linear control and non-linear control. The non-linear control can include a binary search control technique.

BACKGROUND

Advanced microprocessors demand high performance and efficient power delivery circuits. Motherboard (MB) VR or Fully Integrated (FI) VR are existing solutions with an external or in-package inductor. While such switching converter solutions, like FIVR and MBVR, offer higher efficiency operation in certain operating conditions, designing good inductors on-chip or close to silicon remains a challenge. Additionally, due to the physical limitation of the inductor, in which it takes a prohibitive amount of time to change current, inductor-based solutions suffer from relatively poor transient response time.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIG. 5 illustrates, by way of example, a graph of maximum output current as a function of $V_{PG}$ with PG code scaling and without PG code scaling.

FIG. 14 illustrates, by way of example, a diagram of an embodiment of a method for VR control.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Different from inductor-based solutions, aspects include a Non-Linear Control (NLC) and Linear Control (LC) based DLVR. A DLVR in accord with aspects can include no inductor. A DLVR in accord with aspects can be integrated close to a load (e.g., a microprocessor or other load) (e.g., on a same die as the processor). A DLVR in accord with aspects offers significantly faster transient recovery performance through a digitally implemented NLC and LC technique.

In recent years, there has been an increase in adoption of digital Low Drop Out (LDO) VRs with integrated VRs for fine grained Dynamic Voltage and Frequency Scaling (DVFS). Some aspects provide a Digital LDO VR with superior performance. An NLC based LDO VR control approach proposes an approximate computational technique that can operate in tandem with a traditional linear voltage control approach to maximize the bandwidth and settling time of the DLVR while making it robust against parasitic inductances, circuit offsets, loop delays, process, temperature, and voltage and other non-idealities. These performance improvements make aspects a viable technology for applications like graphics, multi-core systems, and other high performance digital loads.

Figure 1:
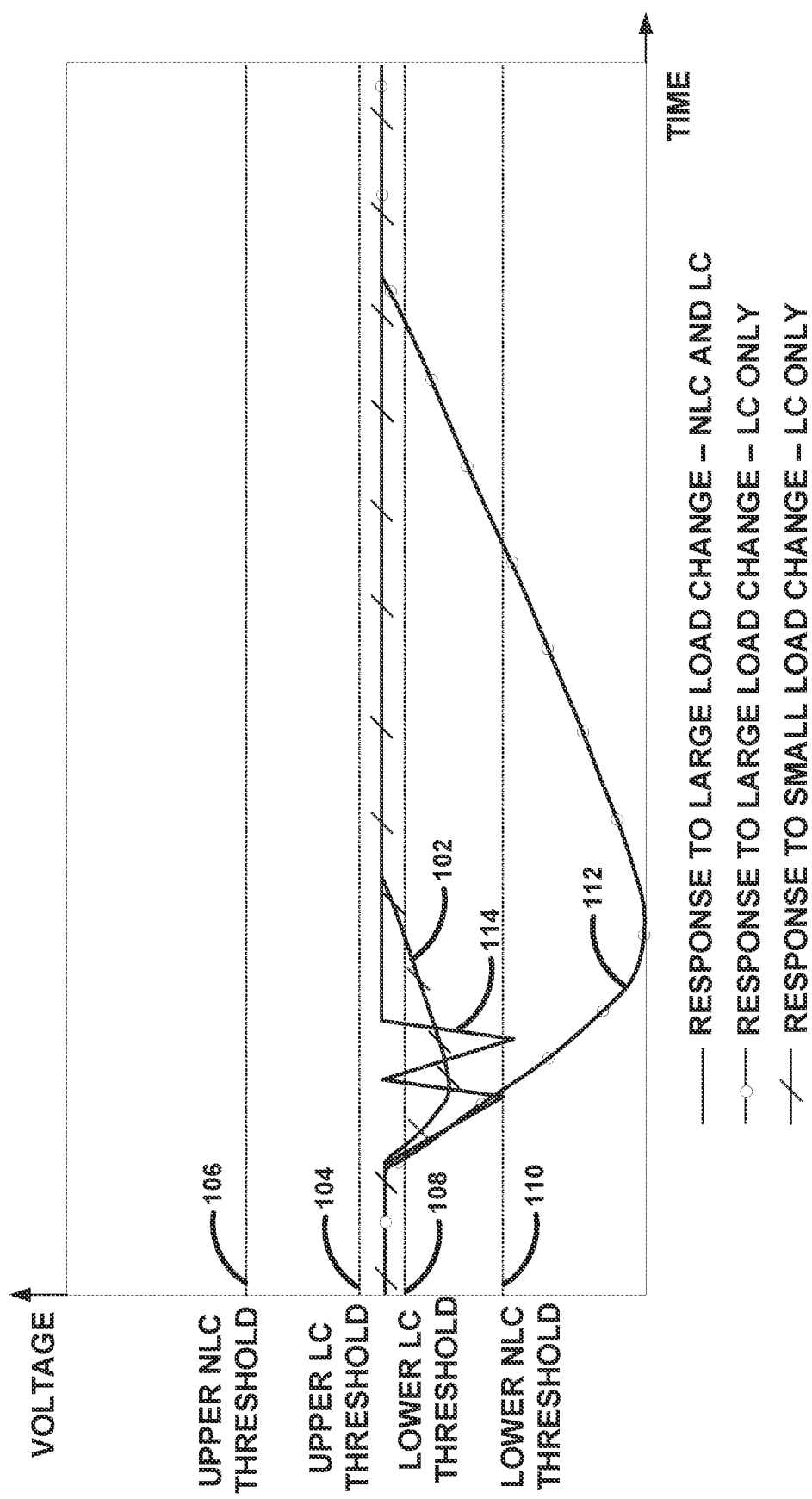
FIG. 1 illustrates, by way of example, a graph of output voltages versus time using various control techniques.

FIG. 1 illustrates, by way of example, a graph of output voltages versus time using various control techniques. The various control techniques include NLC, LC, and a combination thereof.

A line 102 corresponds to a VR controller response to a small load change. A small load change in this context is a load change that moves the output voltage either between (i) an upper LC threshold 104 and an upper NLC threshold 106 or (ii) between a lower LC threshold 108 and a lower NLC threshold 110. With a small load change, an LC technique can be implemented by a controller to return the voltage to between the upper LC threshold 104 and the lower LC threshold 108. A voltage between the upper LC threshold 104 and the lower LC threshold 108 is sometimes called a "nominal" voltage. Small load changes can be mitigated by LC control in a relatively short amount of time without adversely affecting the voltage output from the VR controller. An LC control technique can include one or more step increments or decrements to the output current to adjust the output voltage back to nominal.

A line 112 corresponds to a VR controller response to a large load change with only an LC control technique. A large load change in this context is a load change that moves the output voltage either (i) below the lower NLC threshold 110 or (ii) over the upper NLC threshold 106. The LC control response to such a voltage change is prohibitively slow and can negatively impact performance of a circuit receiving the output voltage. The negative impact can include insufficient current, voltage, or power to operate.

A line 114 corresponds to a VR controller response to a large load change with NLC and LC control. The NLC control corresponding to the line 114 can include using a binary search technique to set the output current such that the output voltage is between the upper LC threshold 104 and the lower LC threshold 108. A binary search technique operates by making larger adjustments to the output current than is done using the LC technique. The NLC controller that implements the binary search technique increases the output current to a specified minimum (when the output voltage goes over the upper NLC threshold 106) then adjusts an output current by a value determined Equation 1:

$$(½)^{N}*(\text{maximum specified current value})$$

Where N is a positive integer that represents the iteration. Thus, the current begins at ½ the maximum specified current value at the first iteration. This operation is explained in more detail regarding FIG. 2, among others. Whether the output current is increased or decreased by the value indicated in Equation 1 is based on whether the output voltage crosses the upper NLC threshold 106 or the lower NLC threshold 110. If the output voltage crosses the upper NLC threshold 106 the output current can be decreased by the value indicated by Equation 1. If the output voltage crosses the lower NLC threshold 110 the output current can be increased by the value indicated by Equation 1.

The load change for the line 114 can be the same as the load change for the line 112. However, the VR controller that generated the voltage corresponding to the line 114 can implement an NLC control for voltages below the lower NLC threshold 110. This control technique brings the output voltage back to nominal faster than the LC technique and without an inductor.

Figure 2:
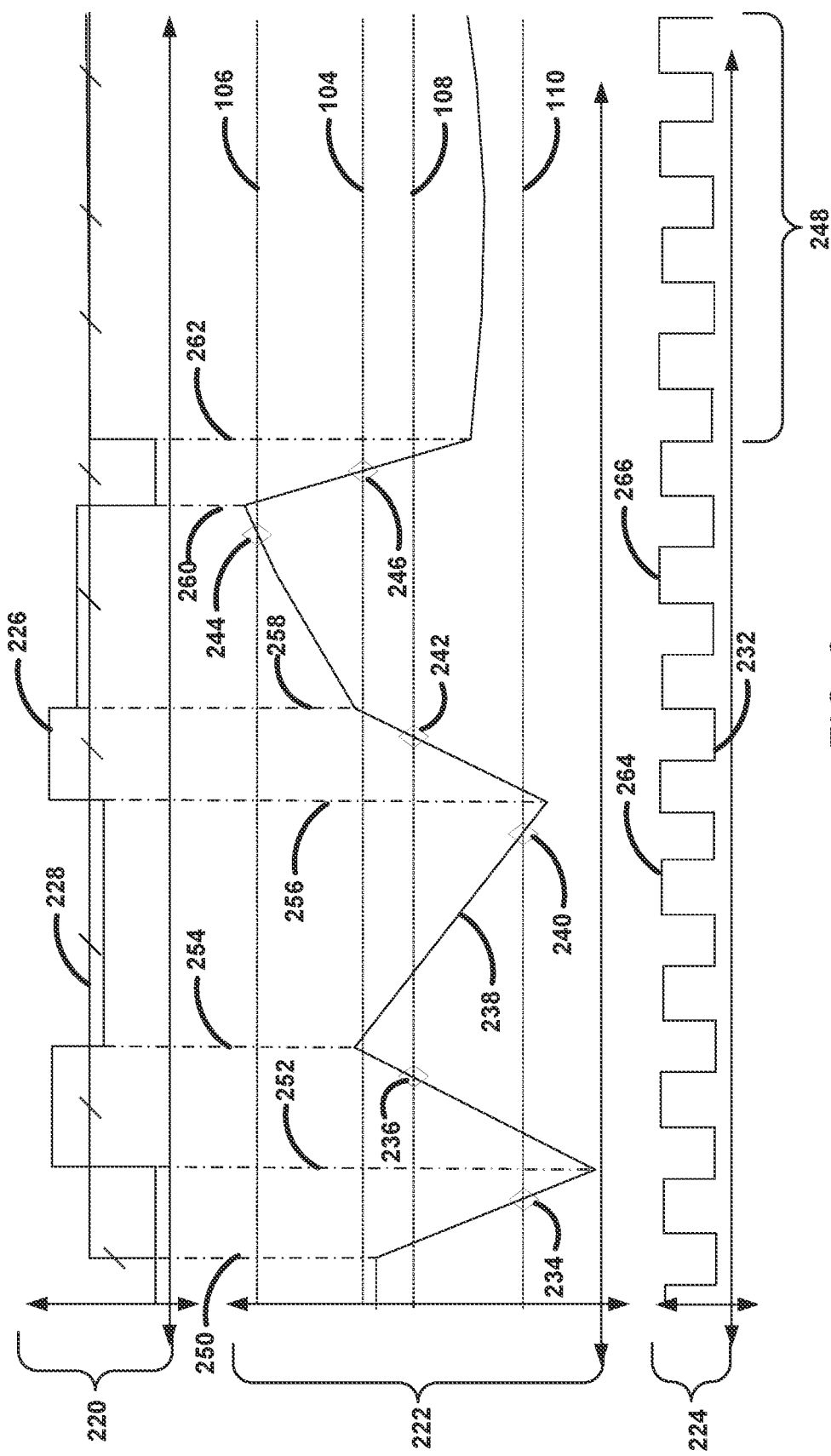
FIG. 2 shows the working principle of a hybrid LC and NLC control technique with a Binary Search Algorithm (BSA) based output current adjustment.

FIG. 2 illustrates, by way of example, various graphs that help understanding of a symmetric hybrid LC and NLC technique. Symmetric means that difference between the upper NLC threshold 106 and the upper LC threshold 104 is about the same (within about 5%) of the difference between the lower NLC threshold 110 and the lower LC threshold 108. The graphs of FIG. 2 include a graph 220 of output current (indicated by line 226) and load current (indicated by line 228) versus time, a graph 222 of output voltage (indicated by line 238) versus time, and a graph 224 of LC clock voltage (indicated by line 232) versus time. Diamonds with reference numbers on the line 238 indicate threshold crossing events that are relevant to VR control using the symmetric hybrid LC and NLC technique. Dotted-dashed lines indicate load or output current events. The events provided are for, at least in part, explanation purposes and many other events and event sequences are possible depending on the load changes.

The events include a first event 234 at which the output voltage (VOUT) indicated by line 238 drops below the lower NLC threshold 110. At event 250, the load current increases. For purposes of description, assume that the load current increased from about 0 Amps (A) to about 12 A. Responsive to the increase in load current, the output voltage starts decreasing. The output voltage decreases past the lower LC threshold 108. This triggers the LC technique, but due to loop delay in the control technique and the magnitude of the increase in the load current, the LC technique does not have sufficient time to begin adjusting the output current.

At event 234, the output voltage (indicated by line 238) crosses the lower NLC threshold 110. Responsive to the event 234, the VR controller can increase the output current (indicated by line 226) to a maximum specified output current value at event 252. Note the time delay between detection and response can be due to the loop delay in the control logic of the VR controller. Then, responsive to the output voltage crosses the lower LC threshold 108 (indicated by event 236), the VR controller can adjust the output current in accord with Equation 1 at event 254. In an instance in which N=1, the VR controller can assume the output current to the average between a specified minimum current value and a specified maximum current value. For sake of description, assume the specified minimum current value is 0 A and the specified maximum current value is 20 A. $(½)^{1}*20$ A=10 A for this example.

The increase in output current at event 254 is still insufficient to drive the load so it causes the output voltage to decrease. The decrease causes the output voltage to drop below the lower LC threshold 108 triggering the LC technique. In the illustrated example, the LC technique is able to begin adjusting the output voltage (indicated by a step 264 in the clock indicated by the line 232). However, the LC technique, in this example, is unable to retain the output voltage above the lower NLC threshold 110. Thus, the output voltage crosses the lower NLC threshold 110 at event 240. Responsive to the event 240, the VR controller sets the output current to the maximum specified value at event 256. Then, when the output voltage has recovered to cross the lower LC threshold 108 at event 242, the VR controller increments an iteration counter (N) and sets the output current in accord with Equation 1 at event 258. In the example being described, $(½)^{2}*20$ A=5 A. The new output current, in this example is thus 10 A+5 A=15 A.

The new output current is more than sufficient to drive the load, so the output voltage increases. The increase causes the output voltage to rise above the upper LC threshold 104 triggering the LC technique. In the illustrated example, the LC technique is able to begin adjusting the output voltage (indicated by a step 266 in the clock indicated by the line 232). However, the LC technique, in this example, is unable to retain the output voltage below the upper NLC threshold 106. Thus, the output voltage crosses the upper NLC threshold 106 at event 244. Responsive to the event 244, the VR controller sets the output current to the minimum specified value at event 260. Then, when the output voltage has recovered to cross the upper LC threshold 104 at event 246, the VR controller increments an iteration counter (N) and sets the output current in accord with Equation 1 at operation 262. In the example being described, $(½)^{3}*20$ A=2.5 A. The new output current, in this example is thus 15 A−2.5 A=12.5 A. This output current is now sufficient for the VR controller to retain the output voltage between the upper NLC threshold 106 and the lower NLC threshold 110 and to adjust the output voltage back to nominal starting in region 248.

FIG. 2 shows the working principle of a hybrid LC and NLC control technique with a Binary Search Algorithm (BSA) based output current adjustment. The hybrid technique allows the VR to respond faster to load current changes. At the onset of a large load, the linear controller starts to change the code that proportionally controls how much output current is provided. However, since the required current is higher than what can be provided at the rate at which the code is incremented, and limited load capacitance charge, the output voltage keeps falling. When the voltage again drops below the lower NLC threshold 110, the VR controller can sense the droop, and the BSA-based NLC can be invoked (e.g., asynchronously). The VR controller (e.g., implemented as a finite state machine (FSM)) can activate enough transistors of a current divider to generate at least the specified maximum current. This change causes the output voltage to return the output voltage to above the lower NLC threshold 110. At this point, the VR controller can apply a first estimated solution (code=50% of PGmax). Since this value is still lower than the increase in the load, the output voltage will decrease again. Upon detecting the subsequent decrease, the VR controller can re-apply the specified maximum current to bring the output voltage back above the lower NLC threshold 110. The VR controller can then apply a second iteration solution to the output current. Since the first iteration estimate (e.g., of 50% max output) falls short of the output current needed to return the voltage to nominal, the VR controller can determine that the expected solution is between 50% and 100% of the maximum output current. The VR controller can use the mid-point of the new search space (e.g., 75%), as shown in FIG. 2. When the solution of this iteration is applied, the output voltage goes into overshoot, since the second iteration estimate of the output current required to put the output voltage at nominal is higher than the increase in the load. Upon detecting the overshoot, the VR controller can reduce the output current to a specified minimum current value (e.g., 0 A or other value) bringing the output voltage back below the upper NLC threshold 106. The VR controller can then determine that the expected output current must be between 75% and 50% of the maximum output current. Hence, the third solution is at 62.5% of the maximum specified output current (about 12.5 A in the example described regarding FIG. 2). This output current is then applied when the output voltage returns below the upper LC threshold 104.

Figure 3:
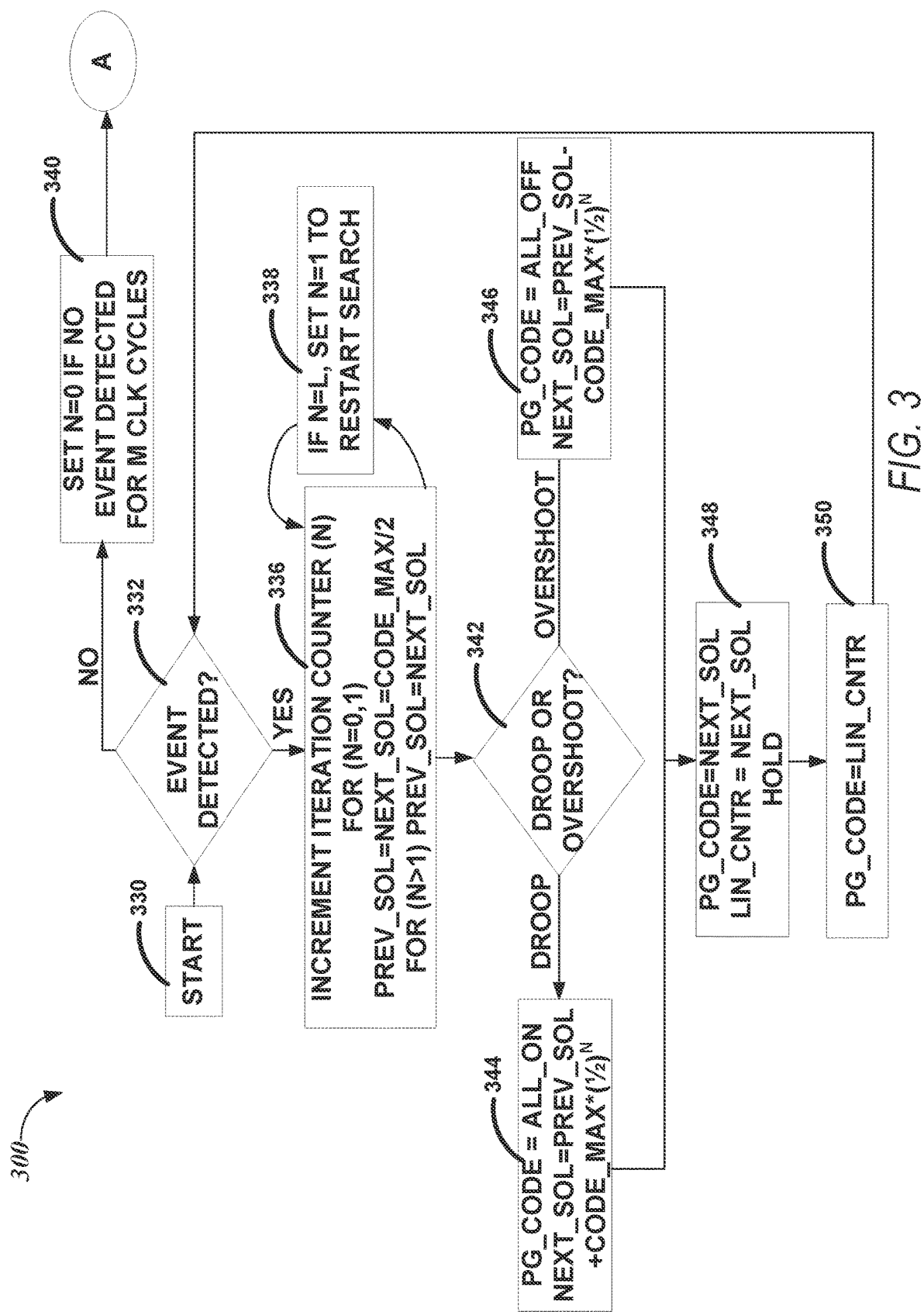
FIGS. 3 and 4 illustrate, by way of example, flow diagrams of respective portions of an embodiment of a hybrid LC and BSA-based NLC control technique.
Figure 4:
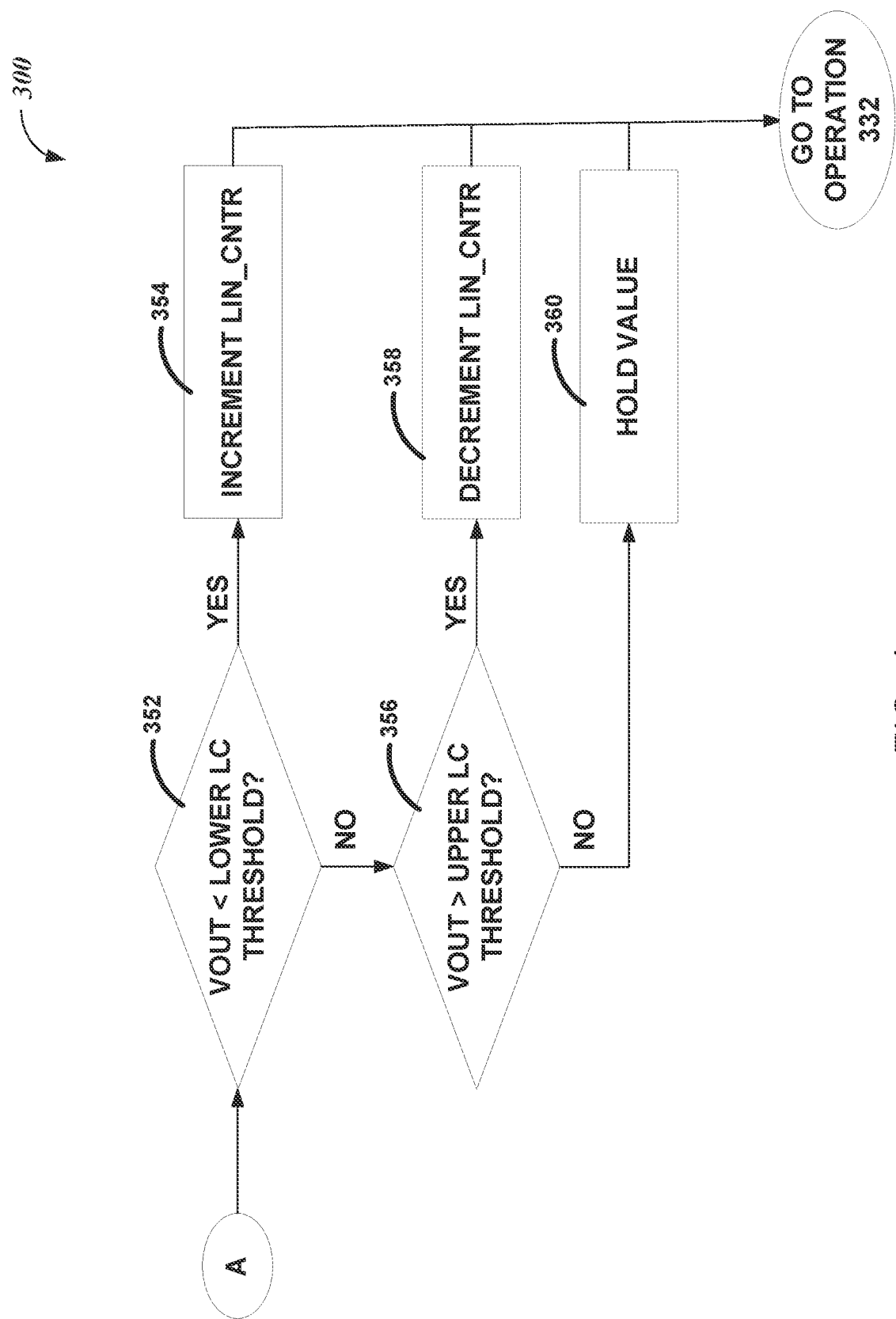

FIGS. 3 and 4 illustrate, by way of example, flow diagrams of respective portions of an embodiment of a hybrid LC and BSA-based NLC control technique 300. The technique 300 as illustrated includes starting at operation 330. At operation 332, the VR controller can determine if an event is detected. The event detection at operation 332 regards whether the output voltage has (i) exceeded the upper NLC threshold 106 or (ii) fallen below the lower NLC threshold. These events correspond to diamonds with reference numbers in FIG. 2. If no such event is detected at operation 332, the technique continues operating using an LC technique. FIG. 4 illustrates flow logic for incrementing, decrementing, or holding the current output current using the LC technique.

If the event is detected at operation 332, the VR controller operates the VR using a BSA-based NLC technique. One or more of the operations 336, 338, 340, 342, 344, 346, 348, or 350 can be part of the BSA-based NLC technique. At operation 336, N can be incremented. If N is zero (0) or one (1), prev_sol (a variable tracking a value of an immediately previous output current provided to the load) can be set to next_sol (a variable tracking a next output current to provide to the load), which can be set to code_max/2 (code_max is a variable tracking a code that represents the maximum specified current output). If N is greater than 1, prev_sol can be set to next_sol without initialization of next_sol.

The operations 338 and 340 are reset mechanisms for the VR controller. The operation 338 includes a reset mechanism that restarts an output current search if the output current does not result in nominal output voltage in a specified number of iterations (L, a positive integer greater than one). Given that the bandwidth of a VR controller is known, the VR controller can be designed to truncate the search pattern after L iterations. For example, if L=6, the output current adjustment on the sixth iteration is $\frac{1}{2}^6$ (or 1.56%). If the load did not converge in the fifth iteration, then the load may have changed during the BSA search. This can cause the BSA technique to not converge. A reset, like at operation 338, can help avoid infinite, or otherwise prohibitively long search loops that do not converge.

The operation 340 is a reset for a new non-linear event (sometimes called a "self-reset"). The operation 340 can occur after the output voltage settles. The operation 340 can include the VR controller waiting for a predefined number of clock periods, and if no new event is detected at operation 332 during the predefined number of clock periods, the VR controller can assume that the linear controller has stabilized and reset the BSA-based NLC technique. The VR controller can always use 50% of the maximum specified output current as the first solution after reset, regardless of whether it detects a droop or an overshoot At operation 342, the VR controller can determine if the event detected at operation 332 corresponds to a droop (output voltage less than the lower NLC threshold 110) or an overshoot (output voltage greater than the upper NLC threshold 106).

If a droop event was determined to have occurred at operation 342, the VR controller can set PG_CODE to a maximum value and NEXT_SOL to PREV_SOL+ CODE_MAX*($\frac{1}{2}$)$^N$ at operation 344. For the case of an NLC droop event, if the VR controller causes a maximum specified current to be provided, then the VR controller can provide the maximum specified current only for the lowest output voltage. For higher output voltage, the VR controller, when maximizing output current, would cause a current draw of more than the maximum specified current if it maximized output current. For example, if the VR is driving the maximum specified output current with an output voltage of 25 mV (when all BIT_EN (see FIG. 6) and SLICE_EN (see FIG. 6) are on), the current supply would try to draw eight (8) times more current for an output voltage of 200 mV. Note that BIT_EN and SLICE_EN are jointly referred to as PG codes. This current draw could prohibitively inhibit operation of a power delivery network (PDN see FIG. 6). In order to limit this current draw, the VR controller can measure the VPG ($V_{IN}$-$V_{OUT}$) to limit the number of bits turned on. In this example—ideally—if DLVR applies a code of 0xFFFF to recover from a droop with a VDS of 25 mV, then all that is needed is a code of 0x1FFF, in order to recover from a VDS dropout of 200 mV. To limit the current intermediate points can be added between the aforementioned VDS levels, using a $\sqrt{2}$ scaling or other scaling. This gives an even spacing of current between points (e.g., $\sqrt{2}$*VPG, 2*$\sqrt{2}$*VPG, etc.). This results in a max current of $\sqrt{2}$* maximum specified current More detail regarding this issue is described regarding FIG. 5.

If an overshoot event was determined to have occurred at operation 342, the VR controller can set PG_CODE to a minimum value and NEXT_SOL to PREV_SOL- CODE_MAX*($\frac{1}{2}$)$^N$ at operation 346. Then at operation 348, the VR controller can set PG_CODE to NEXT_SOL, LIN_CNTR to NEXT_SOL, and implement a delay. LIN_CNTR is a variable that indicates a PG code for the linear VR controller technique. After the delay, PG_CODE can be set to LIN_CNTR. Then the technique 300 can continue at operation 332.

As previously discussed, FIG. 4 illustrates flow logic for incrementing, decrementing, or holding the current output current (a value of LIN_CNTR) using the LC technique. At operation 352, the VR controller can determine whether VOUT has dropped below a lower LC threshold 108. If so, the VR controller can increment LIN_CNTR at operation 354. If not, the VR controller can determine whether VOUT has overshot the upper LC threshold 104 at operation 356. If so, the VR controller can decrement LIN_CNTR at operation 358. If VOUT is neither lesser than the lower LC threshold 108 nor greater than the upper LC threshold 104, the VR controller can hold the present PG_CODE value of LIN_CNTR. After any of the operations 354, 358, or 360 has executed, the technique can continue at operation 332 (see FIG. 3).

FIG. 5 illustrates, by way of example, a graph of maximum output current as a function of VOUT with PG code scaling and without PG code scaling. Given non-idealities, the possible values can be adjusted to guarantee driving at least the specified maximum current. FIG. 5 further illustrates, by way of example, a graph of maximum output current as a function of output voltage with ±5 mV of error (bottom graph). Since the exact amount of error is unknown pre-fabrication, one can provide fuses to help avoid points where output current would exceed the maximum output current. To reduce power in the VR controller clock gating has been added when the output voltage has stabilized. In some instances, multiple DLVRs can be used in conjunction by making one DLVR a primary controller, and the others as pure PG code listeners, whereby they are configured to follow the PG code of the primary controller.

Aspects can operate based on a voltage threshold detection and triggering NLC control technique that is supplemented with an LC control technique. A set of comparators can detect different voltage thresholds (e.g., the upper NLC threshold 106, the upper LC threshold 104, the lower LC threshold 108, and the lower NLC threshold 110) as their references, such that the comparators can provide an output indicating whether the output voltage crosses its respective threshold. The VR controller can change (e.g., increase or decrease) an amount of current of the output voltage, such that the output voltage (VOUT) remains within a regulation window. If, due to a large load transient or other event, the voltage output falls below a lower NLC threshold 110, the NLC is triggered and NLC controller brings the output voltage back to nominal and it does so significantly faster than a typical LC. Similarly, if the output crosses the upper NLC threshold 106, the NLC is activated and brings the output back below the upper NLC threshold 106. For smaller transient events, if the droop/overshoot threshold is not crossed, the controller operates under linear controller (without triggering NLC).

Figure 6:
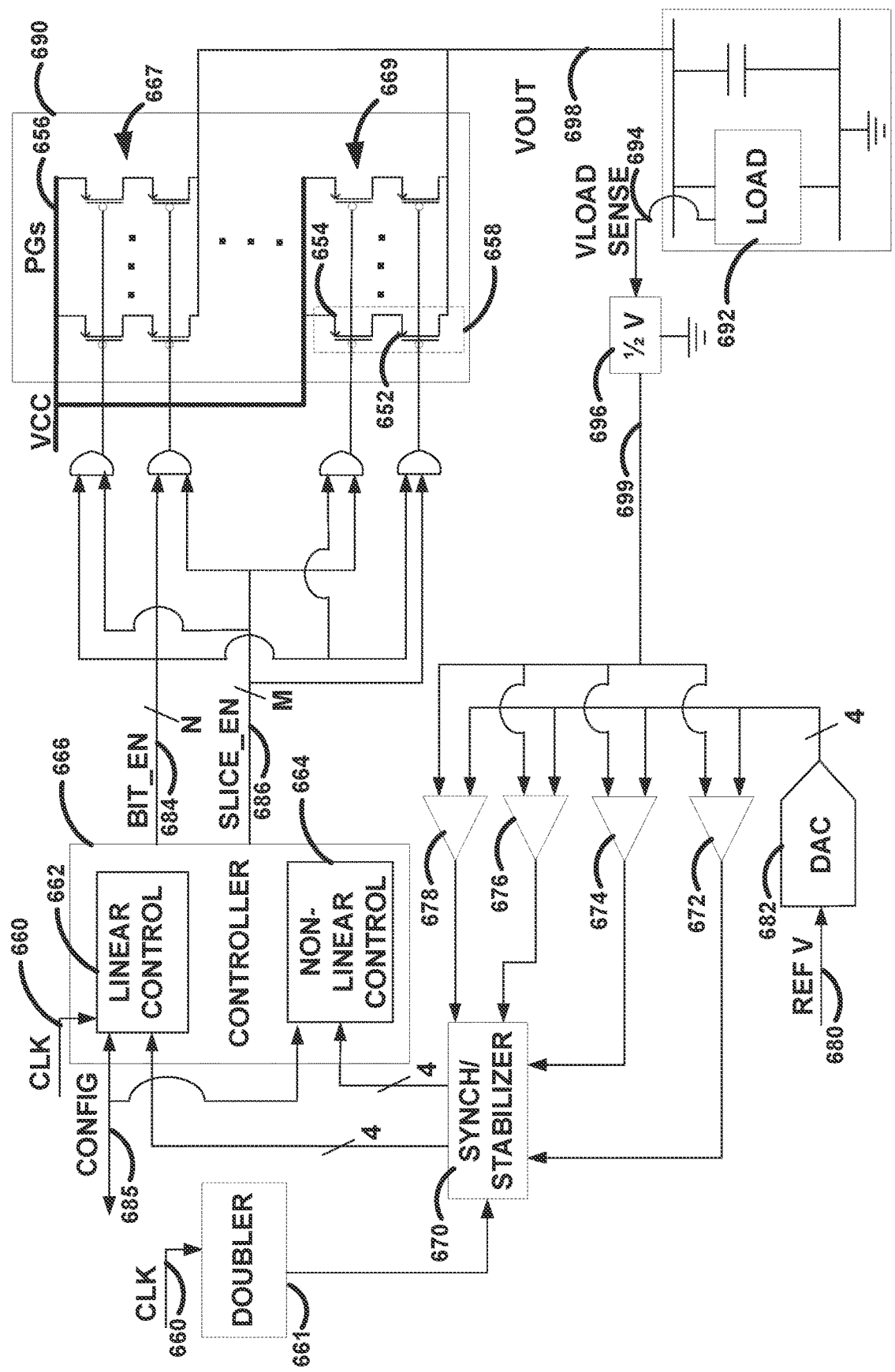
FIG. 6 illustrates, by way of example, a circuit diagram of a VR system with a hybrid LC and NLC controller.

FIG. 6 illustrates, by way of example, a circuit diagram of a VR system with a hybrid LC and NLC controller 666. To supply current to a load 692 while regulating VLOAD 694 at given reference value, the VR controller 666 can operate metal oxide semiconductor (MOS) (or other semiconductor type) power gate (PG) slices 667, 669. Each of the slices are coded with binary weighted power gates where b[0] indicates a least significant bit (LSB) PG device and b[P] indicates the most significant bit (MSB) PG device. Note that the MSB device is about $2^{(P-1)}$ (e.g., if P=15 then the MSB device is 16384) times larger than the LSB device. Each of the PG devices is illustrated as including a stacked configuration (series of two devices). The "lower" device of the stack can be driven by a mid-rail voltage while the upper device can be controlled by the level control logic generated by the digitally implemented 'decision logic' block. Four comparators 672, 674, 676, and 678 (e.g., upper NLC, upper Lin, lower Lin, and lower NLC, respectively) can be inputs for the VR controller 666. The VR controller 666 decides which control technique, the synchronous LC technique implemented by the LC circuitry 662 or the asynchronous NLC technique implemented by the NLC circuitry 664 to implement based on the comparator 672, 674, 676, 678 output. Each of the comparator receives 50% (or other percentage, of the output voltage (VLOAD 694) signal from a voltage divider 696 at one input and the other input can be fed from multiple digital to analog converters (DACs) or a single DAC 682 with multiple outputs. A stable reference voltage (REF V 680) can provide the DAC 682 with a reference voltage to produce the upper NLC threshold 106 fed to comparator 672, the upper LC threshold 104 fed to comparator 674, the lower LC threshold 108 fed to comparator 676, and the lower NLC threshold 110 fed to comparator 678. These threshold voltage levels set the threshold at which NLC and LC are triggered by the VR controller 666.

The VR controller 666 controls VOUT 698 and ultimately VLOAD 694 by changing the binary code provided to the PGs 690. The binary code is set using BIT_EN and SLICE_EN variables that control voltage on control traces 684, 686, respectively. The VR controller 666 can maintain a voltage within a narrow band of +/−5 mV around a target Voltage ID (VID), the nominal voltage.

VLOAD 694 can be sensed, then divided by 2 (or another integer) by the voltage divider 696, before being sent to analog circuitry (e.g., the comparators 672, 674, 676, 678). Hence, the analog circuitry can operate in a "half-voltage" or other partial voltage domain.

The analog circuitry can include a 2-stage DAC (to save area). The first level of the DAC can include a 50-step (or other number of steps) resistive ladder, fed by a trimmed, external system on chip (SoC) band-gap reference of 1V (or other reference voltage level). Assuming 50 steps and a 1V REF V 680, the first level of the DAC can produce 20-mV steps, and is used to generate a 160 mV range, which can be buffered (using two unity gain buffers (UGBs)) and can provide high and low voltage reference voltages for a second level resistive DAC ladder, comprising 256 steps (or other number of steps). Assuming a 256 step second level resistive ladder along with a 50 step first level resistive ladder and a 1V REF V 680 results in a final DAC resolution of 0.625 mV. Since the DAC voltage domain represents half the load domain, each DAC step of 0.625 mV corresponds to 1.25 mV at the load. Four voltage levels can be provided from the second level of the DAC 682 (e.g., using four separate passgate trees), and the four corresponding comparators 672, 674, 676, 678 can be used to compare the voltage to VLOAD/2 699. If VLOAD 694 is within +/−5 mV of the target VID (2.5 mV in the "half domain"), then it can be deemed to be nominal by the VR controller 666. But if VLOAD is either within the top (or bottom) linear regulation zones (either (i) the comparator 674 indicates a voltage is greater than the upper LC threshold 104 while the comparator 672 indicates that the VLOAD/2 699 is less than the upper NLC threshold 106 or (ii) the comparator 676 indicates a voltage is less the lower LC threshold 108 while the comparator 678 indicates that the VLOAD/2 699 is greater than the lower NLC threshold 110), then the digital controller applies a the LC technique implemented by the LC circuitry 662 increase (or decrease) the PG binary code and in order to bring the VLOAD/2 699 back to nominal. If linear control fails to achieve its goal in time, and VLOAD/2 699 becomes either larger than the upper NLC threshold 106 or smaller than the lower NLC threshold 110, then the VR controller 666 can activate the NLC circuitry 664 that implements the NLC to change the PG code to adjust VLOAD/2 699 back within the upper LC threshold 104 or the lower LC threshold 108. The PDN can be designed such that it meets the maximum specified current requirements of a heaviest load 692, which, in turn, guarantees that NLC is effective.

Studies of VR controller 666 control loops show it to be unconditionally stable, albeit with a ripple whose amplitude is directly proportional to a round-trip control loop delay. A VR controller design can aim for a specified loop delay (e.g., about 0.7 ns or a greater or lesser delay), which can result in a bounded voltage ripple in VLOAD 694 (e.g., +/−20 mV). Further, to help maintain accuracy, the UGBs after DAC level-1 employ hardware offset cancellation, driven by an FSM, upon power-up. The cancellation is achieved by adding (or removing) transistors from the DAC UGB's differential stages, thus improving temperature stability of the cancelled offset. The comparators 672, 674, 676, 678 can be similarly hardware (HW) offset-trimmed by circuitry (e.g., an FSM), to within a specified voltage range (e.g., +/−0.625 mV).

The outputs of the comparators 672 and 678 can be protected against meta-stability in case VLOAD/2 699 hovers around a comparison threshold (e.g., the upper NLC threshold 106 or the lower NLC threshold 110). This helps guarantee PG code determinism. The meta-stability protection can be provided by a circuitry-based synchronizers/stabilizers 670. The synchronizers/stabilizers 670 can include a meta stability filter that prevents undefined values from propagating to the VR controller 666. This can be accomplished using transistors that receive output signals from the (i) comparators 672 and 674 or (ii) the comparators 676 and 678 and prevent the output of the comparators from propagating to the VR controller 666 until the output of the comparators differs by transistor threshold voltage.

A circuitry-based synchronizers/stabilizers 670 can keep the output of the comparators 674 and 676 in sync with a clock 660. This keeps the LC synchronous. Note that no such synchronous clocking is used in the NLC circuitry 664 making the NLC asynchronous.

Figure 7:
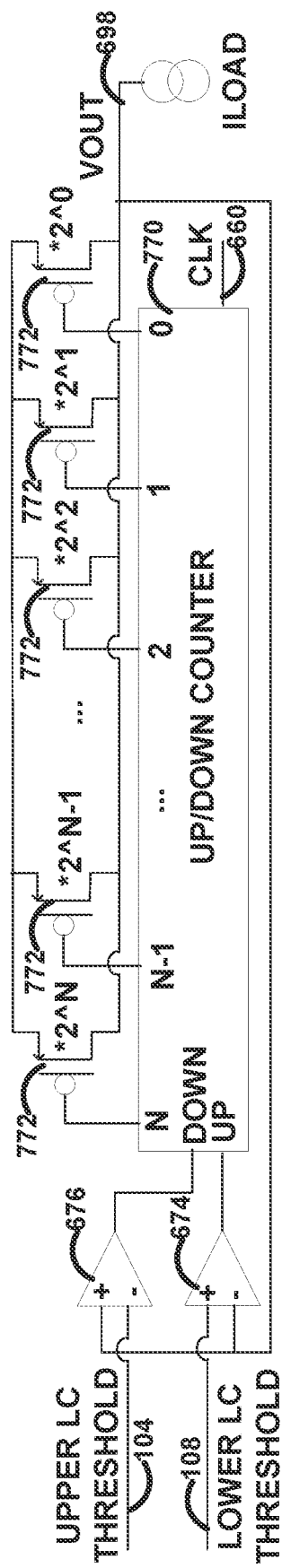
FIG. 7 illustrates, by way of example, a diagram of an embodiment of a PG system including an up/down counter.

FIG. 7 illustrates, by way of example, a diagram of an embodiment of a PG system including an up/down counter 770. A binary PG 772 can be controlled by an up/down counter 770. The counter 770 can be directed to count up or down by output from two comparators 674, 676 which define the regulation window. This approach has a very poor response to load changes at large currents since the increment is only ±1 step (as defined by the number of slices and bits in the PGs 690. While keeping the digital nature of this approach, a VR controller 666 can include an LC circuitry 662 that makes the increment ~½ the size of the range of voltages considered nominal. This helps to normalize the response of the LC circuitry 662 as a function of load current.

A half range response is a function of PG transistor VDS and the latest PG binary code. The half range response can be achieved, by setting delta code=code*Vstep/Vds where delta code is a variable indicating how many counts correspond to half the nominal range. To avoid a full divider, operation is limited to just binary division (binary right shift, dependent on a lookup table based on VDS and step size). A downside to this approach, is that the step size varies from an expected ½ to as little as ¼ window. For example: With an expected Imax of 20 A, a step size of 5 mV, and either a 0.2 V or a 0.4 V VDS with a load current of 5 A, the calculated PG code would be 791 for the 0.2V case, and 391 for the 0.4V case. If the current changes by enough to give a 5-mV drop, then the ideal divisor would be 40 for 0.2 V and 80 for 0.4 V. With binary shift, the closest values would be 64 and 128, respectively, giving an acceptable step size of ~3 mV, not 5 mV.

Another improvement of aspects can include charging a gain increment of the LC circuitry 662 for each iteration based on successive events. For example: a first droop event can produce an increment as calculated above (~½ nominal range). If the next clock is also a droop, then the next increment can be a full nominal range (e.g., 2× the base step), etc.

Also, to prevent the synchronizers/stabilizers 670 (e.g., double-sync flip-flops or the like) (used to synchronize the comparator outputs to the synchronous logic) from contributing too much delay, a clock doubler 661 can be used to drive the synchronizers/stabilizers 670.

The LC circuitry 662 of the VR controller 666 can include a feature that can progressively boost the gain on consecutive droop or overshoot changes. Such a feature can help improve the range of di/dt changes that the LC circuitry 662 can handle without intervention of the NLC circuitry 664. The gain can double every consecutive change in the same direction. The gain can max out at a user specified or manufactured limit, such as to prevent the system bandwidth from suffering. Every time there is a direction change, the gain can reset back to an initialized value.

Feedback from the VLOAD 694 to the controller travels through comparators 672, 674, 676, 678, which are fully asynchronous. This feedback is provided to the VR controller 666, which is fully synchronous. To prevent metastability, the async signals can pass through synchronizers/stabilizers 670 before being provided to the VR controller 666. A fixed delay penalty is paid for such synchronization and stabilization that directly affects the phase margin of the VR controller 666 at a given target bandwidth. To reduce this delay, a programmable clock doubler 661 can be implemented to drive these synchronizers/stabilizers 670. By driving the synchronizers/stabilizers 670 output on the low phase of the doubled clock, phase protection on the downstream logic is realized as the downstream logic is clocked by the original clock.

In DLVR, although a primary control is through a P-MOS PGs 690 device. There can be NMOS devices instantiated to pull an output node low when the load currents have dropped almost to zero. This NMOS control can be useful when the PG 772 device leakage is about the same magnitude as the load current, which could potentially cause the output voltage to drift towards an input voltage, causing an electrical overstress (EOS) violation on the load. A DLVR, at these light loads, start to turn off the slices when the PG code reaches just a single LSB on (e.g., SLICE_EN=0x0001, or the like), but the NMOS kicks in after the last slice has been turned off. Care can be taken to not turn the NMOS on as long as the voltage has not exceeded the upper NLC threshold 106, as active NMOS is wasted power.

There are at least two mechanisms to control the NMOS device. One of them being a timer, which detects when the output voltage (VOUT 698) has been above the upper NLC threshold 106 for a specified amount of time. The second is purely through the LC circuitry 662. The VR controller 666, through the LC circuitry 662 can keep decrementing the PG code and eventually after turning off all the PGs 690, the VR controller 666 can turn on the NMOS device.

Figure 8:
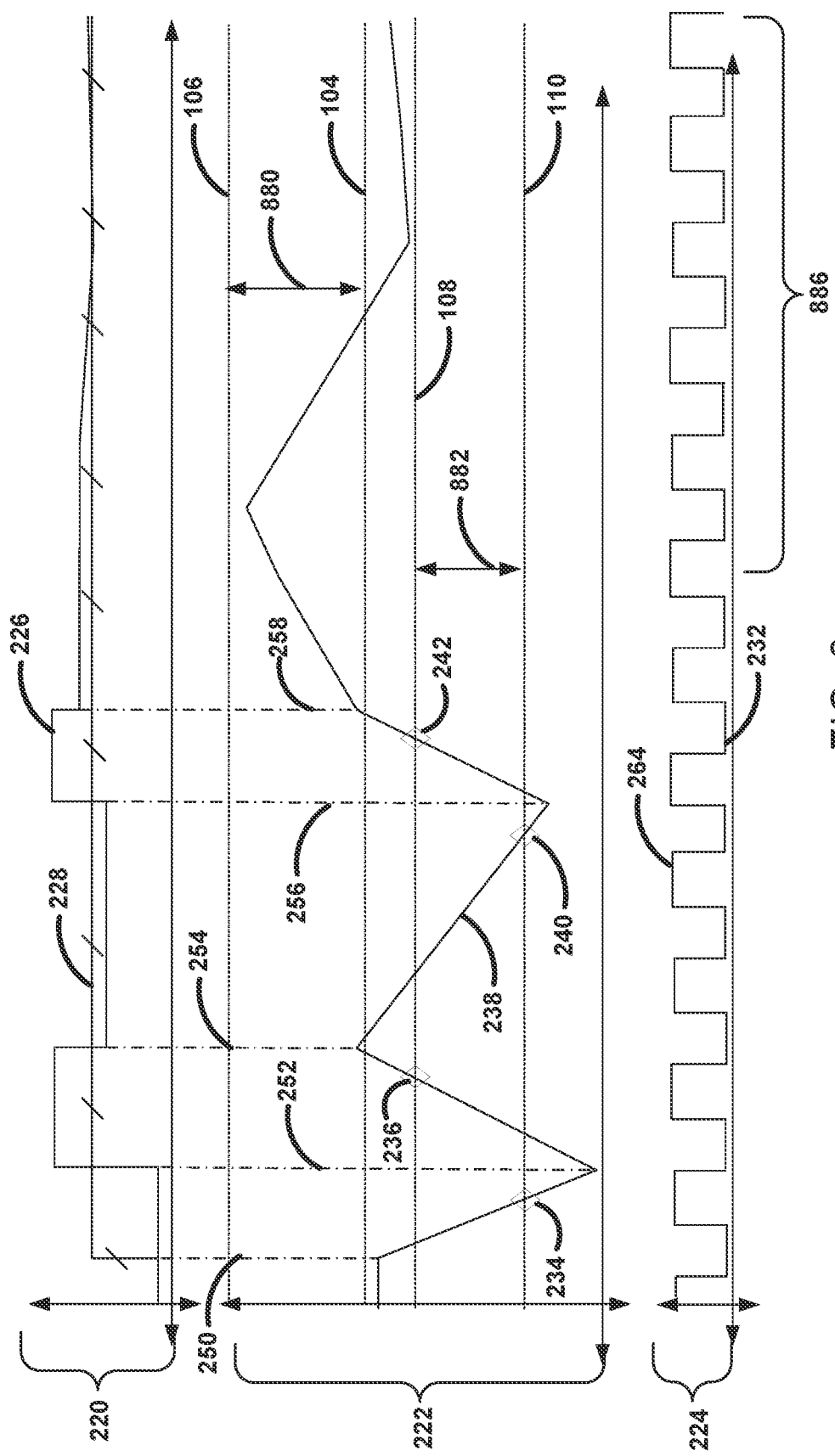
FIG. 8 illustrates, by way of example, various graphs that help understanding of an asymmetric hybrid LC and NLC technique.

FIG. 8 illustrates, by way of example, various graphs that help understanding of an asymmetric hybrid LC and NLC technique. NLC circuitry 664 triggering events can cause input ringing due to a quick turn on and turn off procedure for the asynchronous event initiation and response. While these actions can help protect against droop and overshoot, often a trade-off can be made to improve the noise performance of the circuit by reducing the number of NLC events in a given scenario. Since droop is more critical, because circuitry may cease to operate if the voltage goes too low, the trade-off can be done only on the overshoot side. By allowing a difference between the upper NLC threshold 106 and the upper LC threshold (indicated by double arrow 880) to be at a larger than a difference between the lower NLC threshold 110 and the lower LC threshold 108, it is possible to avoid some overshoot events and thereby reduce the number of the NLC event based noise injections.

FIG. 2 shows the typical operation with both droop and overshoot thresholds symmetrically placed. For a specific load transient, the VR controller 666 may go through a droop-droop-overshoot-settle sequence seen in FIG. 2. However, if the overshoot threshold is moved higher, as shown in FIG. 8, the VR controller 666 can reach a same solution with one less NLC event (no overshoot is detected because the LC circuitry 662 is sufficient to bring the VOUT 698 back to nominal without VOUT exceeding the upper NLC threshold 106). Notice that, the droop performance remains unaffected by this modification and the LC clock continues to operate through period 886.

Similar to asymmetric operation, the VR controller 666 can implement a one sided VR operation. The VR controller 666 configurations discussed thus far offer voltage confined operation, meaning the NLC is triggered on both the lower NLC threshold 110 (during voltage droop) and the upper NLC threshold 106 (during voltage overshoot). Often times, a microprocessor power delivery, droop events can be more important than overshoot events and hence circuitry can be simplified by focusing only on the droop events. The VR controller 666 can be reconfigured (using a configuration input 685, post-fabrication, to operate as a one-sided, droop-based only operation. In this setup, the NLC circuitry 664 is triggered only when a droop event is detected, and the VR controller 666 solves the droop event as discussed regarding FIG. 2. Overshoot events do not trigger the NLC circuitry 664 and hence the LC circuitry 662 resolves the overshoot events by slowly reducing the PG 772 values. This control scenario is sometimes called a 'One-Sided BSA operation'. Note that if the upper NLC threshold 106 is set sufficiently high (e.g., higher than operating conditions) such that the VOUT 698 will not cross that threshold in any operating condition, One-sided BSA operation can be achieved.

Figure 9:
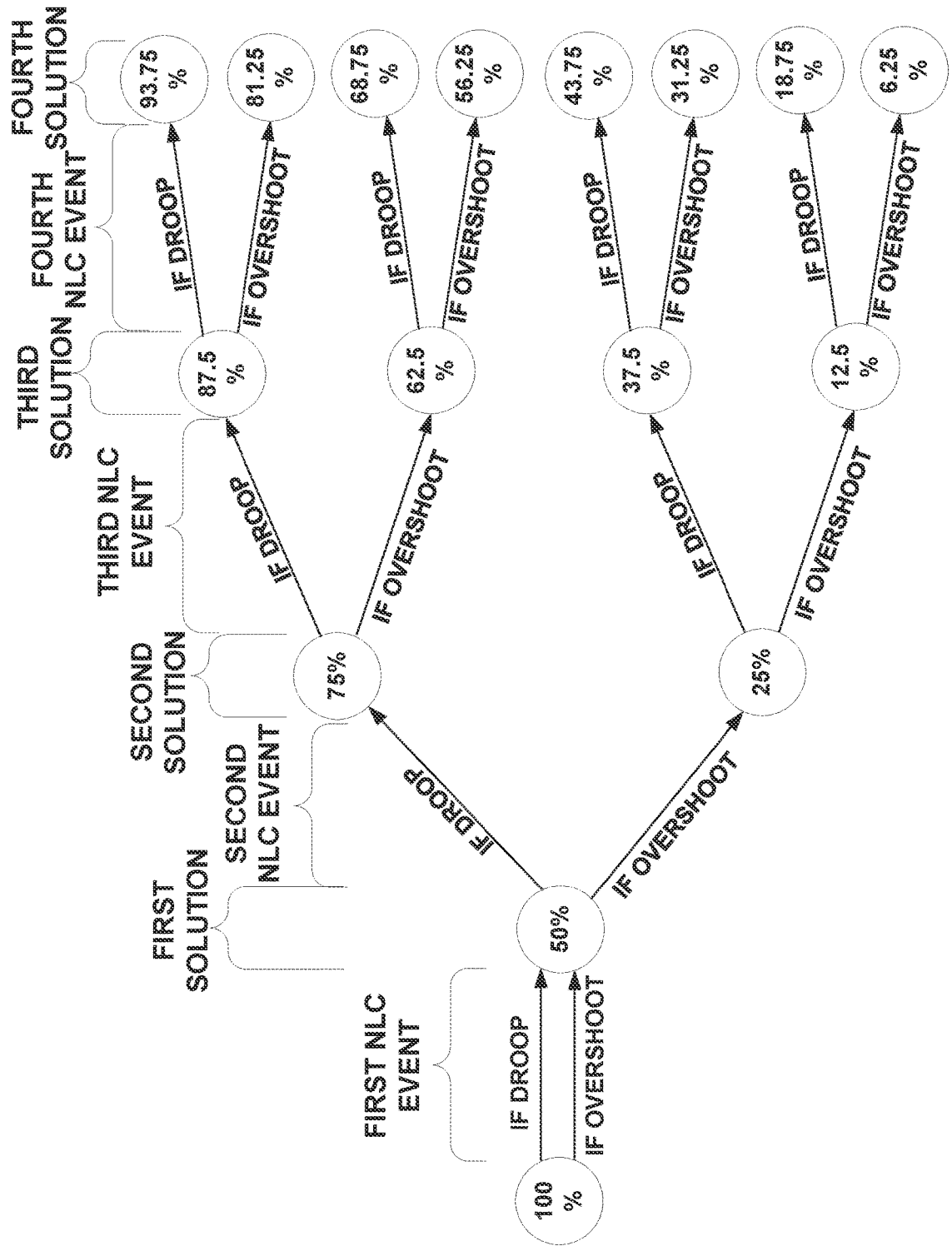
FIGS. 9 and 10 illustrate, by way of example, NLC circuitry logic solutions for NLC events that occur consecutively without a reset event between consecutive events for droop and overshoot protection and for droop protection only, respectively.
Figure 10:
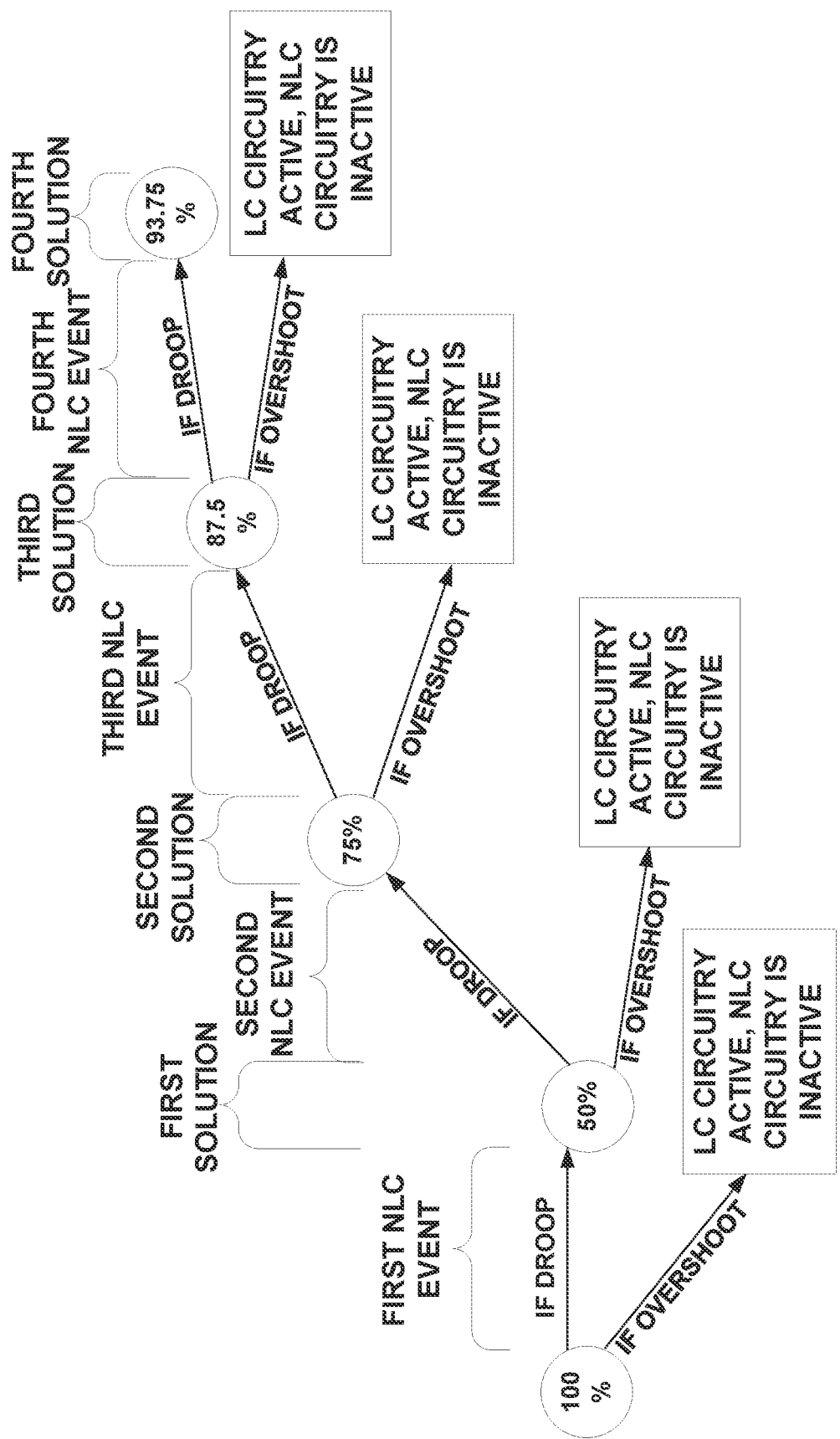

FIGS. 9 and 10 illustrate, by way of example, NLC circuitry 664 solutions for NLC events that occur consecutively without a reset event between consecutive events for droop and overshoot protection and for droop protection only, respectively. FIG. 9 illustrates a binary tree evolution of the PG 772 code solution after NLC events with standard, droop and overshoot NLC operation. After a first NLC event, the PG code is set to 50% regardless of an NLC droop event (VLOAD/2 699 less than the lower NLC threshold 110) or an NLC overshoot event (VLOAD/2 699 greater than the upper NLC threshold 106). The PG code is adjusted at each successive iteration of the event counter (N) based on whether the NLC event is a droop event or an overshoot event. On the fourth iteration, the PG code is adjusted about 6.25%. FIG. 10 illustrates binary search tree logic for a solution with only droop NLC event protection. If an overshoot NLC event is detected at after any of the solutions, the LC circuitry 662 manages the voltage regulation and the NLC circuitry is inactive. Otherwise, for successive NLC droop events, the PG code is increased by $\frac{1}{2}^N$ beginning with the second NLC event, where N is the number of events or iterations.

To reliably operate a power VR system, it is advantageous to consider robustness of the controller operation, analyze corner cases, and find out stressed conditions for devices and offer mitigating solutions. Several robustness techniques are discussed that help make the VR system and the PG devices reliable and robust across different process corners and process, voltage, and temperature (PVT) conditions.

To prevent static or dynamic offsets in the comparators 672, 674, 676, 678 from creating unintended state transitions, the comparator inputs can be prioritized to prevent loss of regulation or overvoltage conditions. Given the four comparators 672, 674, 676, 678 shown in FIG. 6, the priority can be as follows:
1. Comparator 672
2. Comparator 678
3. Comparator 674
4. Comparator 676

This order prevents a droop from crashing the system, an overshoot from causing a long term reliability concern, and then priority is given to voltages that are too low.

A PG code boost can be used to compensate for a dominant output pole. When the VR is operated at a relatively low current level, the resistance of the output devices can become relatively large. This large resistance, along with an output capacitance can create a resonance pole with a lower frequency than the clock update frequency of the VR controller 666. If this dominant output pole is not compensated for, it can cause the LC circuitry 662 to have unwanted oscillations since any change in the code (a change in the output resistance) takes longer to settle than the time between code updates. This results in multiple output updates that then either overshoot or undershoot the desired value. Code updates could be spread out in time to allow the system to settle correctly, but this leads to a poor response to transient steps.

To compensate for this, a minimum code can be applied for a single cycle to inject enough charge to change the value of the output capacitance by the desired amount. For example, if a specific change in the output value is desired one can use an I=C*dv/dt equation to calculate a code needed, such as by substituting in the output capacitance, the desired voltage step size, and the period of one clock cycle (for time). This way it is realized that the current is equal to the current per output device multiplied by the code needed to provide the output voltage step.

The nominal capacitance, voltage step and clock period are known quantities and a rough estimate of the current per output device can be calculated using either the PG code and the current sensor result or a predefined function of the VDS for the output devices. Once this code is known it can be applied for a single clock cycle to move the output voltage by the desired amount and then the system can switch to the newly calculated value which will then provide the correct direct current (DC) to maintain the new voltage level. This value does not need to be precise to reduce the overshoot/undershoot of the linear system at relatively low load currents.

Figure 11:
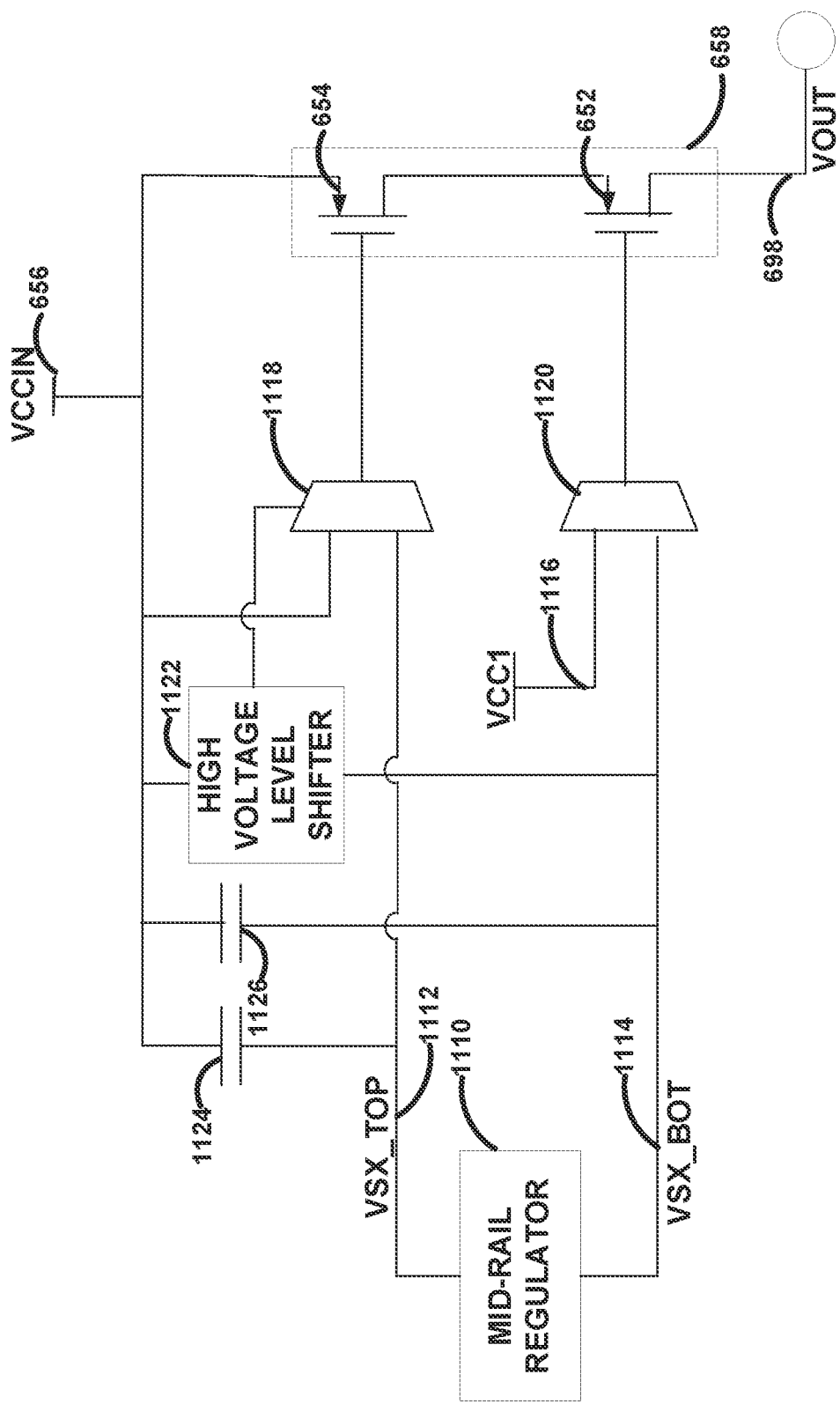
FIG. 11 illustrates, by way of example, a circuit diagram of an embodiment of Fin Self Heat (FiSH) protection circuitry.

FIG. 11 illustrates, by way of example, a circuit diagram of an embodiment of Fin Self Heat (FiSH) protection circuitry. To avoid exceeding a FiSH limit, each PG cell 658 can include two transistors. Assume the VLOAD 694 can reach about 1.4V, and VCCIN 656 can reach about 1.65V. With these assumptions, to avoid transistor junction breakdown in the transistors in the PG cell 658, one can control top PG transistor 654 and bottom PG transistor 652 gates using two different voltage ranges. A mid-rail regulator 1110 can be employed to generate independent voltage levels VSX_TOP 1112 and VSX_BOT 1114. Along with VCCIN 656 and VCC1 1116, this yields 4 voltage levels (two ranges) for FiSH protection.

A VR system can employ a current sensor. "Replica PG cells" can be around the PG slices 667, 669. The gates of the replica PG cells can be driven by a respective mid-rail voltage, while their source terminals can be connected to VCCIN 656. To achieve accurate replication, the drain voltage of the replicas can be set to VLOAD 694 using a feedback control loop. The sum of the currents from all replicas can passed through an HVM calibrated Thin Film Resistor (TFR), and the resulting voltage can be measured by an analog to digital (ADC) converter. The resulting code can be multiplied by the PG code, yielding a number proportional to a load current. The ADC can be additionally used for measuring analog voltages around the controller, during debug.

An analog multiplexer (MUX) 1118 for the top PG transistor 654 can be controlled with a high-voltage level shifter 1122 between VCCIN 656 and VSX_BOT 1114. A metal-insulator-metal (MiM) capacitor 1124, 1126 (e.g., on the order of several nano Farads (nF)) can couple VSX_TOP 1112 and VSX_BOT 1114 to VCCIN 656. An analog MUX 1120 on the bottom PG transistor 652 can be used in the VR off-state to apply a highest possible voltage, such as to reduce current leakage.

The top PG transistor 654 serves at least two functions. First, it acts as a switch to turn individual PG elements/branches on and off. Second, it limits current through the PG cell so that FiSH is not exceeded. The current limiting scheme can be based on a worst case condition seen at the maximum fast/hot PVT corner and with a maximum voltage difference across the PG (e.g., when VOUT=0V and VCCIN=1.8V). The VSX_TOP 1112 rail can be coupled to the VCCIN 656 rail with a large MiM cap 1124. The voltage regulating loop can be switching PG transistors on and off and injecting a large switch cap current onto the VSX_TOP 1112 rail, which can be filtered out. The analog MUX 1118 between VSX_TOP 1112 and the top PG transistor 654 resides between VCCIN 656 and VSX_BOT 1114, such as to protect from High-Voltage Electrical Over-stress (HVEOS) of thin gate devices. The bottom PG transistor 652 provides HVEOS protection and can serve to mitigate FiSH by absorbing some of the total voltage drop across the PG, thus spreading thermal power more evenly across the two PG transistors 652, 654. As a cascode device, the gate of the bottom PG transistor 652 can be kept at VCCIN 656 minus a specified voltage (e.g., 1.05V or other voltage), such as to help ensure the top PG transistor 654 gate-to-drain voltage limit is not exceeded. There is also an analog MUX 1120 to apply VCC1 1116 (e.g., a 1V power supply rail) to the bottom PG transistor 652, such as to completely turn off the PG transistor 652 at lower VCCIN 656 levels, or to reduce leakage as much as possible when VCCIN 656 is above a specified voltage (e.g., ~1V or another voltage).

Figure 12:
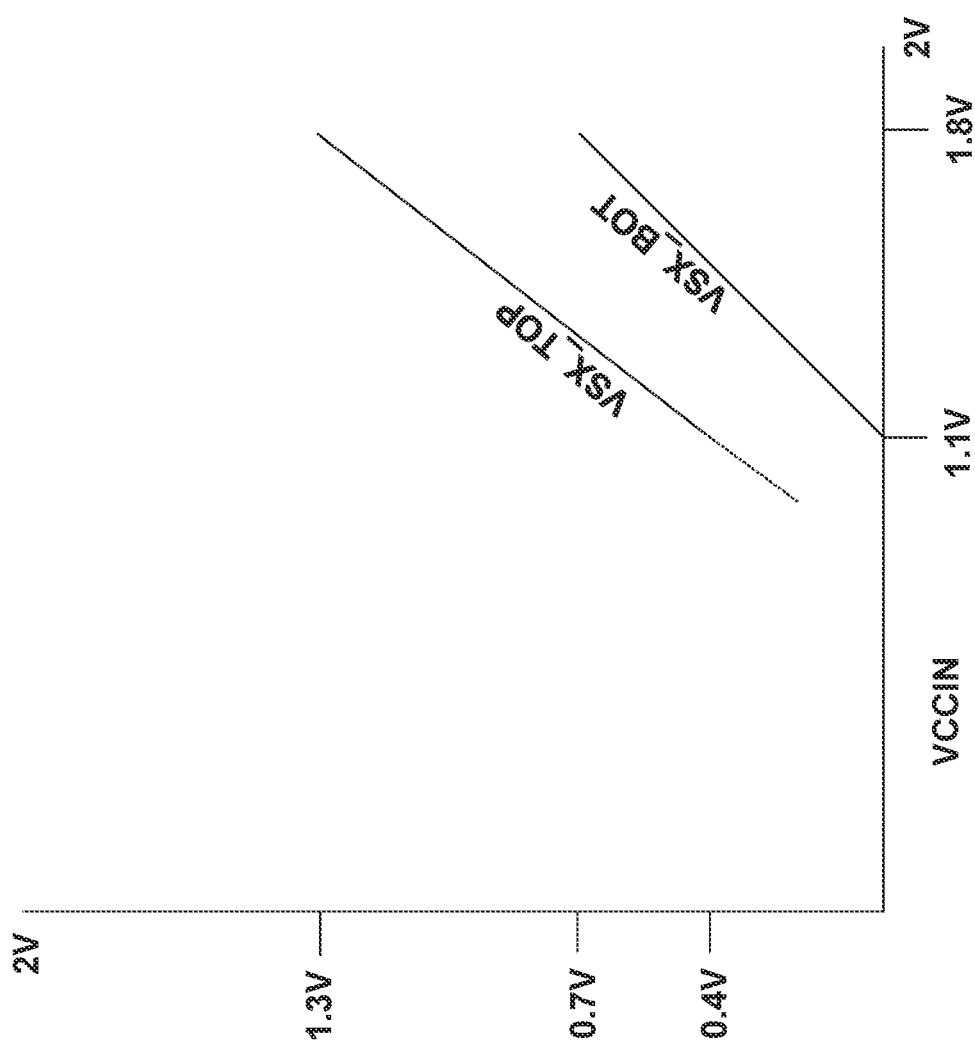
FIG. 12 illustrates, by way of example, a graph of an embodiment of reference voltages VSX_TOP and VSX_BOT generated as a function of VCCIN.

FIG. 12 illustrates, by way of example, a graph of an embodiment of reference voltages VSX_TOP 1112 and VSX_BOT 1114 generated as a function of VCCIN 656. Reference voltages VSX_TOP 1112 and VSX_BOT 1114 can be generated to apply to the top PG transistor 654 and the bottom PG transistor 652 (e.g., with buffers). These reference voltages can be derived from VCCIN 656 using a differential amplifier circuit (see FIG. 13). The two reference voltages can be proportional to VCCIN 656 with a DC offset.

FIG. 12 illustrates VSX_BOT 1114 can be directly proportional to VCCIN 656 with a 1:1 ratio and −1.05V offset. VSX_BOT 1114 can be set to 0V or VCCIN 656 minus 1.05V, whichever is greater. VSX_TOP 1112 can have a steeper slope than VSX_BOT 1114, such as to help ensure FiSH is not violated under worst-case conditions (e.g., fast/hot PVT with maximum VDS, while providing ample current at lower VCCIN 656).

FiSH has been analyzed across PVT conditions to find safe voltages for VSX_TOP 1112 and VSX_BOT 1114. A straight-line for VSX_TOP 1112 can be used with VSX_BOT 1114 kept at the minimum value for HV protection: VCCIN 656 minus 1.05V or 0V (whichever is greater). At VCCIN=1.8V, VSX_TOP=1.3V and VSX_BOT=0.7V, the highest possible current per branch will not violate FiSH. This is when the VOUT 698 is 0V and the max VDS is seen across the power-gate devices. As VCCIN 656 is reduced, the same analysis can be performed to check if the values for VSX_TOP 1112 and VSX_BOT 1114 satisfy FiSH. Around VCCIN=1.1V, when VSX_BOT=0V, VSX_TOP can be pulled to 0V, such as with an NMOS switch. Since VSX_TOP can be driven with a PMOS source-follower, it will not track linearly down to 0V like VSX_BOT, which can be driven with an NMOS common source output stage. There can be an NMOS pulldown connected to VSX_TOP 1112 to pull it to 0V instead of letting it sit at a PMOS VGS. Note these voltages are merely implementation-specific examples and can vary by design tradeoffs and choices.

Figure 13:
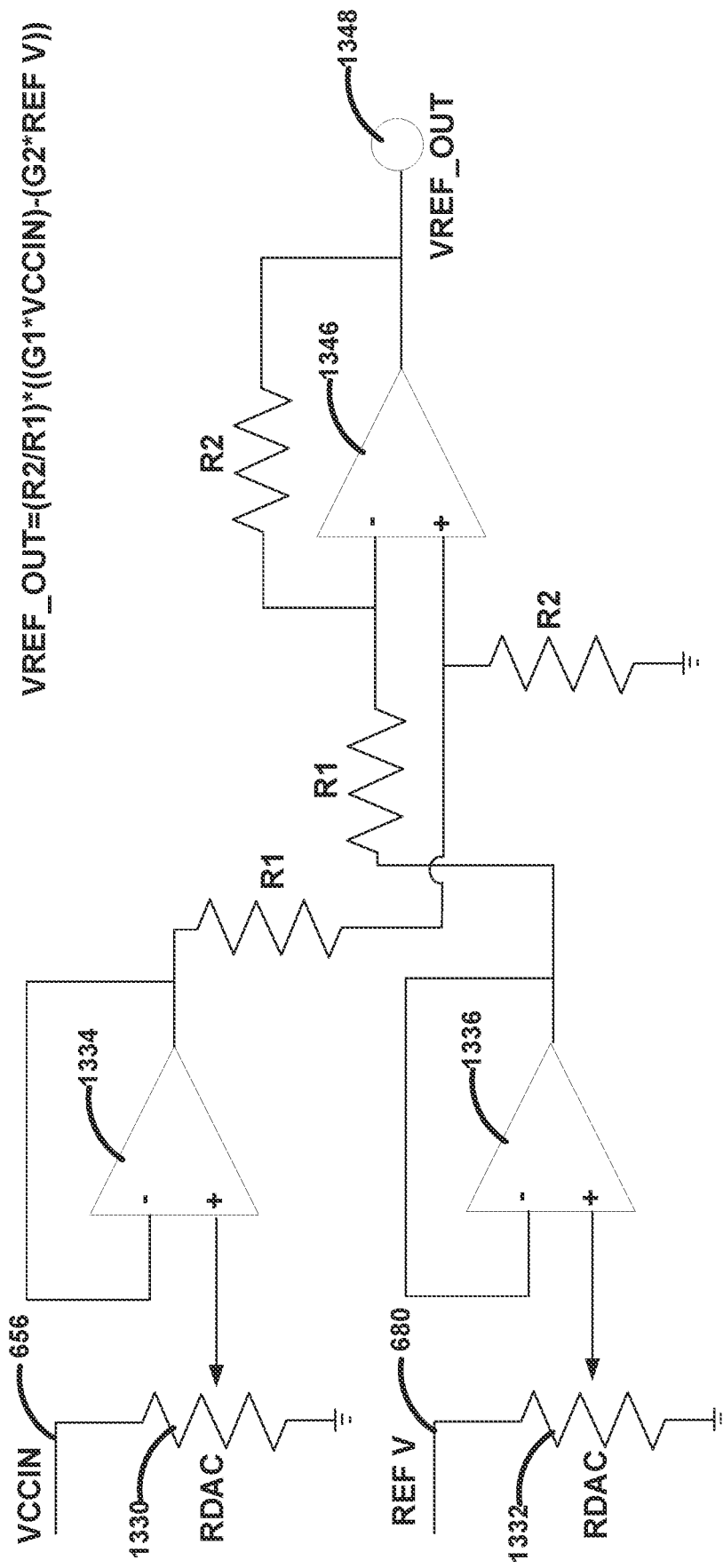
FIG. 13 illustrates, by way of example, a differential amplifier circuit, such as can be implemented by the mid-rail regulator to generate each of the two mid-rail voltages.

FIG. 13 illustrates, by way of example, an instrumentation amplifier circuit, such as can be implemented by the mid-rail regulator 1110 to generate each of the mid-rail voltages (VSX_TOP 1112 and VSX_BOT 1114). The input voltages can be supplied from a resistor DAC (RDAC) as indicated by "RDAC" labelled resistors 1330, 1332. The instrumentation amplifier circuit as illustrated includes VCCIN 656 and the REF V 680 as inputs. Operational amplifiers 1334, 1336, 1346 can jointly amplify VCCIN 656 based on RDAC. An offset of the instrumentation amplifier can be REF_V 680\*RDAC. VREF_OUT 1348 can be provided by the amplifier 1346. The VREF_OUT 1348 can be configured to be VSX_BOT 1114, or VSX_TOP 1112.

FIG. 14 illustrates, by way of example, a diagram of an embodiment of a method 1400 for VR control. The method 1400 as illustrated includes receiving, at voltage regulator (VR) controller circuitry and from first, second, and third comparators data indicating whether a load voltage (VLOAD) (i) drops below a lower non-linear control (NLC) threshold, (ii) drops below a lower linear control (LC) threshold, and (iii) exceeds an upper LC threshold, respectively, at operation 1440; responsive to the received data, determining, by the VR controller circuitry, whether to activate synchronous LC circuitry or asynchronous NLC circuitry, the LC circuitry configured to increment or decrement a power gate (PG) code responsive to the VLOAD dropping below the LC threshold and exceeding the upper LC threshold, respectively, and the NLC circuitry configured to increase the PG code based on a number of consecutive NLC droop events and responsive to the VLOAD dropping below the lower NLC threshold, at operation 1442; providing, by the activated synchronous LC circuitry or asynchronous NLC circuitry, the PG code to the PG 690 configured to adjust an output voltage (VOUT) based on the provided PG code, at operation 1444; and providing the adjusted VOUT to a load, at operation 1446. The NLC circuitry can implement a binary search algorithm (BSA) to increase the PG code.

The method 1400 can further include determining, by a fourth comparator, whether the VLOAD exceeds an upper NLC threshold. The method 1400 can further include, responsive to determining the VLOAD exceeds the upper NLC threshold, decreasing, by the NLC circuitry, the PG code based on a number of consecutive NLC droop and overshoot events and responsive to the VLOAD exceeding the upper NLC threshold.

The method 1400 can further include providing, by clock circuitry, a clock signal to regulate operation of the VR controller circuitry. The method 1400 can further include receiving, by clock doubler circuitry, the clock signal from the clock and provide a signal twice a frequency of the output of the clock signal to first and second stabilizer circuits. The method 1400 can further include receiving, by the first and second stabilizer circuits, output of the second and third comparators, respectively, and providing, by the first and second stabilizer circuits stabilized output of the second and third comparators to the VR controller circuitry.

The method 1400 can further include generating, by a mid-rail voltage regulator, two intermediate voltages and providing the two intermediate voltages to the PG 690. The method 1400 can further include, wherein the PG 690 comprises a plurality of PG transistor cells and the method further comprises selecting, by a first multiplexer electrically connected between the mid-rail voltage generator and the plurality of PG transistor cells, between a first intermediate voltage of the intermediate voltages and a first regulated voltage such that a first fin self-heat (FiSH) limit of a PG transistor cell of the PG transistor cells is not violated. The method 1400 can further include selecting, by a second multiplexer electrically connected between the mid-rail voltage generator and the plurality of PG transistor cells, between a second intermediate voltage of the intermediate voltages and a second regulated voltage such that a second FiSH limit of the PG transistor cell of the PG transistor cells is not violated.

The method 1400 can further include, wherein a difference between the lower LC threshold and the lower NLC threshold is less than a difference between the upper LC threshold and the upper NLC threshold. The method 1400 can further include priority encoding inputs to the controller circuitry from the comparators in the following event order NLC droop event indicating VLOAD dropped below the lower NLC threshold, NLC overshoot event indicating VLOAD exceeded the upper NLC threshold, LC droop event indicating VLOAD dropped below the lower LC threshold, and LC overshoot event indicating VLOAD exceeded the upper LC threshold.

Figure 15:
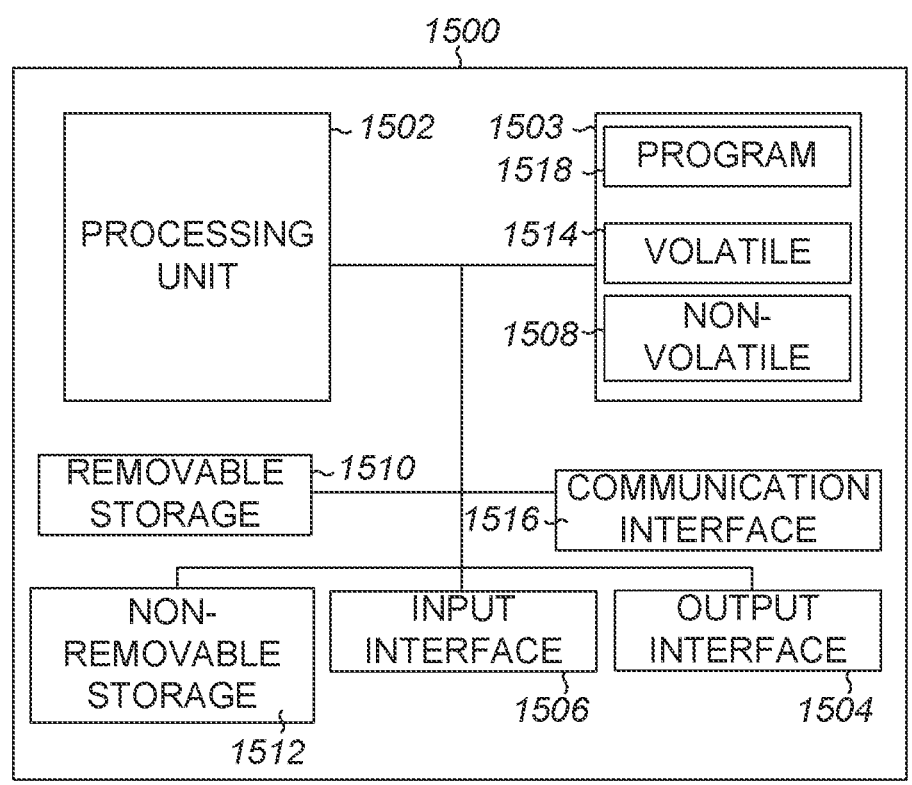
FIG. 15 illustrates, by way of example, a block diagram of an embodiment of a machine (e.g., a computer system) to implement one or more embodiments.

FIG. 15 illustrates, by way of example, a block diagram of an embodiment of a machine 1500 (e.g., a computer system) to implement one or more embodiments. The machine 1500 can implement a technique for improved VR controller operation. The VR controller 666 or a component thereof can include one or more of the components of the machine 1500. One or more of the VR controller 666, method 1400, or a component or operations thereof can be implemented, at least in part, using a component of the machine 1500. One example machine 1500 (in the form of a computer), may include a processing unit 1502, memory 1503, removable storage 1510, and non-removable storage 1512. Although the example computing device is illustrated and described as machine 1500, the computing device may be in different forms in different embodiments. Further, although the various data storage elements are illustrated as part of the machine 1500, the storage may also or alternatively include cloud-based storage accessible via a network, such as the Internet.

Memory 1503 may include volatile memory 1514 and non-volatile memory 1508. The machine 1500 may include—or have access to a computing environment that includes—a variety of computer-readable media, such as volatile memory 1514 and non-volatile memory 1508, removable storage 1510 and non-removable storage 1512. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 1500 may include or have access to a computing environment that includes input 1506, output 1504, and a communication connection 1516. Output 1504 may include a display device, such as a touchscreen, that also may serve as an input device. The input 1506 may include one or more of a touchscreen, touchpad, mouse, keyboard, camera, one or more device-specific buttons, one or more sensors integrated within or coupled via wired or wireless data connections to the machine 1500, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 1502 (sometimes called processing circuitry) of the machine 1500. A hard drive, CD-ROM, and RAM are some examples of articles including a non-transitory computer-readable medium such as a storage device. For example, a computer program 1518 may be used to cause processing unit 1502 to perform one or more methods or algorithms described herein.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Additional Notes and Examples

Example 1 includes an apparatus comprising first, second, and third comparators configured to determine whether a load voltage (VLOAD) (i) drops below a lower non-linear control (NLC) threshold, (ii) drops below a lower linear control (LC) threshold, and (iii) exceeds an upper LC threshold, respectively, PGs configured to adjust an output voltage (VOUT) based on a provided power gate (PG) code, voltage regulator (VR) controller circuitry comprising synchronous LC circuitry and asynchronous NLC circuitry, the LC circuitry configured to increment or decrement the PG code responsive to the VLOAD dropping below the LC threshold and exceeding the upper LC threshold, respectively, and the NLC circuitry configured to increase the PG code based on a number of consecutive NLC droop events and responsive to the VLOAD dropping below the lower NLC threshold.

In Example 2, Example 1 can further include, wherein the NLC circuitry implements a binary search algorithm (BSA) to increase the PG code.

In Example 3, at least one of Examples 1-2 can further include a fourth comparator configured to determine whether the VLOAD exceeds an upper NLC threshold, and wherein the NLC circuitry is further configured to decrease the PG code based on a number of consecutive NLC droop and overshoot events and responsive to the VLOAD exceeding the upper NLC threshold.

In Example 4, at least one of Examples 1-3 can further include a clock coupled to regulate operation of the VR controller circuitry, first and second stabilizer circuits configured to receive the output of the second and third comparators, respectively, and a clock doubler configured to receive output of the clock and provide a signal twice a frequency of the output of the clock to the first and second stabilizers.

In Example 5, at least one of Examples 1-4 can further include a mid-rail voltage regulator configured to generate two intermediate voltages and provide the two intermediate voltages to the PGs.

In Example 6, Example 5 can further include, wherein the PGs comprise a plurality of PG transistor cells and the apparatus further comprises a first multiplexer electrically connected between the mid-rail voltage generator and the plurality of PG transistor cells, the first multiplexer configured to select between a first intermediate voltage of the intermediate voltages and a first regulated voltage such that a first fin self-heat (FiSH) limit of a PG transistor cell of the PG transistor cells is not violated.

In Example 7, Example 6 can further include a second multiplexer electrically connected between the mid-rail voltage generator and the plurality of PG transistor cells, the second multiplexer configured to select between a second intermediate voltage of the intermediate voltages and a second regulated voltage such that a second FiSH limit of the PG transistor cell is not violated.

In Example 8, at least one of Examples 3-7 can further include, wherein a difference between the lower LC threshold and the lower NLC threshold is less than a difference between the upper LC threshold and the upper NLC threshold.

In Example 9, at least one of Examples 3-8 can further include, wherein inputs to the controller circuitry from the comparators are priority encoded in the following event order NLC droop event indicating VLOAD dropped below the lower NLC threshold, NLC overshoot event indicating VLOAD exceeded the upper NLC threshold, LC droop event indicating VLOAD dropped below the lower LC threshold, and LC overshoot event indicating VLOAD exceeded the upper LC threshold.

Example 10 includes a method for voltage regulation comprising receiving, at voltage regulator (VR) controller circuitry and from first, second, and third comparators data indicating whether a load voltage (VLOAD) (i) drops below a lower non-linear control (NLC) threshold, (ii) drops below a lower linear control (LC) threshold, and (iii) exceeds an upper LC threshold, respectively, responsive to the received data, determining, by the VR controller circuitry, whether to activate synchronous LC circuitry or asynchronous NLC circuitry, the LC circuitry configured to increment or decrement a power gate (PG) code responsive to the VLOAD dropping below the LC threshold and exceeding the upper LC threshold, respectively, and the NLC circuitry configured to increase the PG code based on a number of consecutive NLC droop events and responsive to the VLOAD dropping below the lower NLC threshold, providing, by the activated synchronous LC circuitry or asynchronous NLC circuitry, the PG code to PGs configured to adjust an output voltage (VOUT) based on the provided PG code, and providing the adjusted VOUT to a load.

In Example 11, Example 10 can further include, wherein the NLC circuitry implements a binary search algorithm (BSA) to increase the PG code.

In Example 12, at least one of Examples 10-11 can further include determining, by a fourth comparator, whether the VLOAD exceeds an upper NLC threshold, and responsive to determining the VLOAD exceeds the upper NLC threshold, decreasing, by the NLC circuitry, the PG code based on a number of consecutive NLC droop and overshoot events and responsive to the VLOAD exceeding the upper NLC threshold.

In Example 13, at least one of Examples 10-12 can further include providing, by clock circuitry, a clock signal to regulate operation of the VR controller circuitry, receiving, by clock doubler circuitry, the clock signal from the clock and provide a signal twice a frequency of the output of the clock signal to first and second stabilizer circuits, and receiving, by the first and second stabilizer circuits, output of the second and third comparators, respectively, and providing, by the first and second stabilizer circuits stabilized output of the second and third comparators to the VR controller circuitry.

In Example 14, at least one of Examples 10-13 can further include generating, by a mid-rail voltage regulator, two intermediate voltages and providing the two intermediate voltages to the PGs.

In Example 15, Example 14 can further include, wherein the PGs comprises a plurality of PG transistor cells and the method further comprises selecting, by a first multiplexer electrically connected between the mid-rail voltage generator and the plurality of PG transistor cells, between first and second intermediate voltages of the intermediate voltages such that a first fin self-heat (FiSH) limit of a PG transistor cell of the PG transistor cells is not violated.

In Example 16, Example 15 can further include selecting, by a second multiplexer electrically connected between the mid-rail voltage generator and the plurality of PG transistor cells, between a third intermediate voltage of the intermediate voltages and a regulated voltage such that a second FiSH limit of the PG transistor cell of the PG transistor cells is not violated.

In Example 17, at least one of Examples 12-16 can further include, wherein a difference between the lower LC threshold and the lower NLC threshold is less than a difference between the upper LC threshold and the upper NLC threshold.

In Example 18, at least one of Examples 12-17 can further include priority encoding inputs to the controller circuitry from the comparators in the following event order NLC droop event indicating VLOAD dropped below the lower NLC threshold, NLC overshoot event indicating VLOAD exceeded the upper NLC threshold, LC droop event indicating VLOAD dropped below the lower LC threshold, and LC overshoot event indicating VLOAD exceeded the upper LC threshold.

Example 19 can include an apparatus comprising first, second, third, and fourth comparators configured to determine whether a load voltage (VLOAD) (i) drops below a lower non-linear control (NLC) threshold, (ii) drops below a lower linear control (LC) threshold, (iii) exceeds an upper LC threshold, and (iv) exceeds an upper NLC threshold, respectively, power gates (PGs) configured to adjust an output voltage (VOUT) based on a provided power gate (PG) code, voltage regulator (VR) controller circuitry comprising synchronous LC circuitry and asynchronous NLC circuitry, the LC circuitry configured to increment or decrement the PG code responsive to the VLOAD dropping below the LC threshold and exceeding the upper LC threshold, respectively, and the NLC circuitry configured to increase the PG code based on a number of consecutive NLC droop events and responsive to the VLOAD dropping below the lower NLC threshold and decrease the PG code based on a number of consecutive NLC droop and overshoot events and responsive to the VLOAD exceeding the upper NLC threshold, a mid-rail voltage regulator configured to generate two intermediate voltages and provide the two intermediate voltages to the PGs, a first multiplexer electrically connected between the mid-rail voltage generator and a plurality of PG transistor cells, the first multiplexer configured to select between first and second intermediate voltages of the intermediate voltages such that a first fin self-heat (FiSH) limit of a PG transistor cell of the PG transistor cells is not violated, and a second multiplexer electrically connected between the mid-rail voltage generator and the plurality of PG transistor cells, the second multiplexer configured to select between a third intermediate voltage of the intermediate voltages and a regulated voltage such that a second FiSH limit of the PG transistor cell is not violated.

In Example 20, Example 19 can further include, wherein a difference between the lower LC threshold and the lower NLC threshold is less than a difference between the upper LC threshold and the upper NLC threshold.

In Example 21, at least one of Examples 19-20 can further include, wherein inputs to the controller circuitry from the comparators are priority encoded in the following event order NLC droop event indicating VLOAD dropped below the lower NLC threshold, NLC overshoot event indicating VLOAD exceeded the upper NLC threshold, LC droop event indicating VLOAD dropped below the lower LC threshold, and LC overshoot event indicating VLOAD exceeded the upper LC threshold.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus comprising:
   first, second, and third comparators configured to determine whether a load voltage (VLOAD) (i) drops below a lower non-linear control (NLC) threshold, (ii) drops below a lower linear control (LC) threshold, and (iii) exceeds an upper LC threshold, respectively;

power gates (PGs) configured to adjust an output voltage (VOUT) based on a provided power gate (PG) code;

voltage regulator (VR) controller circuitry comprising synchronous LC circuitry and asynchronous NLC circuitry, the LC circuitry configured to increment or decrement the PG code responsive to the VLOAD dropping below the LC threshold and exceeding the upper LC threshold, respectively, and the NLC circuitry configured to increase the PG code based on the VLOAD dropping below the lower NLC threshold; and a fourth comparator configured to determine whether the VLOAD exceeds an upper NLC threshold, wherein the NLC circuitry is further configured to decrease the PG code based on the VLOAD exceeding the upper NLC threshold.

2. The apparatus of claim 1, wherein the NLC circuitry implements a binary search algorithm (BSA) to increase the PG code.

3. The apparatus of claim 1, further comprising:
a clock coupled to regulate operation of the VR controller circuitry;
first and second synchronizer/stabilizer circuits configured to receive outputs of the second and third comparators, respectively; and
a clock doubler configured to receive an output of the clock and provide a signal twice a frequency of the output of the clock to the first and second synchronizers/stabilizers.

4. The apparatus of claim 1, further comprising a mid-rail voltage regulator configured to generate two intermediate voltages and provide the two intermediate voltages to the PGs.

5. The apparatus of claim 4, wherein the PGs comprises a plurality of PG transistor cells and the apparatus further comprises:
a first multiplexer electrically connected between the mid-rail voltage generator and the PGs, the first multiplexer configured to select between a first intermediate voltage of the two intermediate voltages and a first regulated voltage such that a first fin self-heat (FiSH) limit of a PG transistor cell of the PG transistor cells is not violated.

6. The apparatus of claim 5, further comprising:
a second multiplexer electrically connected between the mid-rail voltage generator and the PGs, the second multiplexer configured to select between a second intermediate voltage of the two intermediate voltages and a second regulated voltage such that a second FiSH limit of the PG transistor cells is not violated.

7. The apparatus of claim 1, wherein a difference between the lower LC threshold and the lower NLC threshold is less than a difference between the upper LC threshold and the upper NLC threshold.

8. The apparatus of claim 1, wherein inputs to the controller circuitry from the comparators are priority encoded in the following event order: NLC droop event indicating the VLOAD dropped below the lower NLC threshold; NLC overshoot event indicating the VLOAD exceeded the upper NLC threshold; LC droop event indicating the VLOAD dropped below the lower LC threshold; and LC overshoot event indicating the VLOAD exceeded the upper LC threshold.

9. A method for voltage regulation comprising: receiving, at voltage regulator (VR) controller circuitry and from first, second, and third comparators data indicating whether a load voltage (VLOAD) (i) drops below a lower non-linear control (NLC) threshold, (ii) drops below a lower linear control (LC) threshold, and (iii) exceeds an upper LC threshold, respectively; responsive to the received data, determining, by the VR controller circuitry, whether to activate synchronous LC circuitry or asynchronous NLC circuitry, the LC circuitry configured to increment or decrement a power gate (PG) code responsive to the VLOAD dropping below the LC threshold and exceeding the upper LC threshold, respectively, and the NLC circuitry configured to increase the PG code based on the VLOAD dropping below the lower NLC threshold; providing, by the activated synchronous LC circuitry or asynchronous NLC circuitry, the PG code to power gates (PGs) configured to adjust an output voltage (VOUT) based on the provided PG code; providing the adjusted VOUT to a load; and determining, by a fourth comparator, whether the VLOAD exceeds an upper NLC threshold, and responsive to determining the VLOAD exceeds the upper NLC threshold, decreasing, by the NLC circuitry, the PG code based on the VLOAD exceeding the upper NLC threshold.

10. The method of claim 9, wherein the NLC circuitry implements a binary search algorithm (BSA) to increase the PG code.

11. The method of claim 9, further comprising:
providing, by clock circuitry, a clock signal to regulate operation of the VR controller circuitry;
receiving, by clock doubler circuitry, the clock signal from the clock and provide a signal twice a frequency of the output of the clock signal to first and second synchronizer/stabilizer circuits; and
receiving, by the first and second synchronizer/stabilizer circuits, outputs of the second and third comparators, respectively, and providing, by the first and second synchronizer/stabilizer circuits a stabilized output of the second and third comparators to the VR controller circuitry.

12. The method of claim 9, further comprising generating, by a mid-rail voltage regulator, two intermediate voltages and providing the two intermediate voltages to the PGs.

13. The method of claim 12, wherein the PGs comprise a plurality of PG transistor cells and the method further comprises:
selecting, by a first multiplexer electrically connected between the mid-rail voltage generator and the PGs, between a first intermediate voltage of the two intermediate voltages and a first regulated voltage such that a first fin self-heat (FiSH) limit of a PG transistor cell of the PG transistor cells is not violated.

14. The method of claim 13, further comprising:
selecting, by a second multiplexer electrically connected between the mid-rail voltage generator and the PGs, between a second intermediate voltage of the two intermediate voltages and a second regulated voltage such that a second FiSH limit of the PG transistor cell of the PG transistor cells is not violated.

15. The method of claim 9, wherein a difference between the lower LC threshold and the lower NLC threshold is less than a difference between the upper LC threshold and the upper NLC threshold.

16. The method of claim 9, further comprising priority encoding inputs to the controller circuitry from the comparators in the following event order: NLC droop event indicating the VLOAD dropped below the lower NLC threshold; NLC overshoot event indicating the VLOAD exceeded the upper NLC threshold; LC droop event indicating the VLOAD dropped below the lower LC threshold; and LC overshoot event indicating the VLOAD exceeded the upper LC threshold.

17. An apparatus comprising:
first, second, third, and fourth comparators configured to determine whether a load voltage (VLOAD) (i) drops below a lower non-linear control (NLC) threshold, (ii) drops below a lower linear control (LC) threshold, (iii) exceeds an upper LC threshold, and (iv) exceeds an upper NLC threshold, respectively;
power gates (PGs) configured to adjust an output voltage (VOUT) based on a provided power gate (PG) code;
voltage regulator (VR) controller circuitry comprising synchronous LC circuitry and asynchronous NLC circuitry, the LC circuitry configured to increment or decrement the PG code responsive to the VLOAD dropping below the LC threshold and exceeding the upper LC threshold, respectively, and the NLC circuitry configured to increase the PG code based on a number of consecutive NLC droop events and responsive to the VLOAD dropping below the lower NLC threshold and decrease the PG code based on a number of consecutive NLC droop and overshoot events and responsive to the VLOAD exceeding the upper NLC threshold;
a mid-rail voltage regulator configured to generate two intermediate voltages and provide the two intermediate voltages to the PGs;
a first multiplexer electrically connected between the mid-rail voltage generator and a plurality of PG transistor cells, the first multiplexer configured to select between a first intermediate voltage of the intermediate voltages and a first regulated voltage such that a first fin self-heat (FiSH) limit of a PG transistor cell of the PG transistor cells is not violated; and
a second multiplexer electrically connected between the mid-rail voltage generator and the plurality of PG transistor cells, the second multiplexer configured to select between a second intermediate voltage of the intermediate voltages and a second regulated voltage such that a second FiSH limit of the PG transistor cell is not violated.

18. The apparatus of claim 17, wherein a difference between the lower LC threshold and the lower NLC threshold is less than a difference between the upper LC threshold and the upper NLC threshold.

19. The apparatus of claim 17, wherein inputs to the controller circuitry from the comparators are priority encoded in the following event order:
NLC droop event indicating VLOAD dropped below the lower NLC threshold;
NLC overshoot event indicating VLOAD exceeded the upper NLC threshold;
LC droop event indicating VLOAD dropped below the lower LC threshold; and
LC overshoot event indicating VLOAD exceeded the upper LC threshold.

* * * * *